(12) United States Patent
Endo et al.

(10) Patent No.: US 11,933,644 B2
(45) Date of Patent: Mar. 19, 2024

(54) TOUCH DETECTING APPARATUS

(71) Applicant: ALPS ALPINE CO., LTD., Tokyo (JP)

(72) Inventors: Shinichi Endo, Miyagi (JP); Hiroki Nagakusa, Liaoning (CN); Ryo Komatsu, Miyagi (JP); Sho Taguchi, Miyagi (JP); Daisuke Washio, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 36 days.

(21) Appl. No.: 17/809,094

(22) Filed: Jun. 27, 2022

(65) Prior Publication Data
US 2023/0013855 A1   Jan. 19, 2023

(30) Foreign Application Priority Data

Jul. 16, 2021   (JP) .................................. 2021-118082

(51) Int. Cl.
| | | |
|---|---|---|
| *G01D 5/24* | (2006.01) | |
| *G06F 3/041* | (2006.01) | |
| *G06F 3/044* | (2006.01) | |
| *B62D 1/06* | (2006.01) | |

(52) U.S. Cl.
CPC .............. *G01D 5/24* (2013.01); *G06F 3/0418* (2013.01); *G06F 3/044* (2013.01); *B62D 1/06* (2013.01)

(58) Field of Classification Search
CPC ......... G01D 5/24; G06F 3/0418; G06F 3/044; G06F 3/0488; G06F 3/04182; G06F 3/01; B62D 1/046; H03K 17/962; H03K 2217/94026; H03K 2217/94031
See application file for complete search history.

(56) References Cited

U.S. PATENT DOCUMENTS

| | | | | |
|---|---|---|---|---|
| 2006/0267953 | A1* | 11/2006 | Peterson ............. | G06F 3/04186 345/173 |
| 2011/0157076 | A1* | 6/2011 | Chang .................. | G06F 3/0418 345/174 |
| 2012/0001859 | A1* | 1/2012 | Kim ..................... | G06F 3/04182 345/173 |
| 2012/0293447 | A1* | 11/2012 | Heng ................... | G06F 3/04186 345/174 |

(Continued)

FOREIGN PATENT DOCUMENTS

| | | | |
|---|---|---|---|
| CN | 202177880 U | * | 3/2012 |
| CN | 102855032 A | * | 1/2013 |

(Continued)

*Primary Examiner* — Yoshihisa Ishizuka
*Assistant Examiner* — Joshua L Forristall
(74) *Attorney, Agent, or Firm* — IPUSA, PLLC

(57) ABSTRACT

A touch detecting apparatus includes an electrostatic sensor provided on an object; and a processor configured to detect whether a hand touches the object based on a capacitance measured by the electrostatic sensor. The processor is configured to, in response to the capacitance being greater than or equal to a first touch threshold, detect that the hand touches the object, and, for a second predetermined time from when a change amount of the capacitance during a first predetermined time becomes greater than or equal to a noise threshold, continue a state where a correction value has been added to the first touch threshold.

8 Claims, 21 Drawing Sheets

(56) References Cited

U.S. PATENT DOCUMENTS

| | | | |
|---|---|---|---|
| 2013/0147752 A1* | 6/2013 | Simmons | G06F 3/0443 |
| | | | 345/174 |
| 2014/0358463 A1* | 12/2014 | Tanaka | H03K 17/9622 |
| | | | 702/65 |
| 2015/0184991 A1* | 7/2015 | Nakabayashi | G06F 3/0446 |
| | | | 345/174 |
| 2018/0087929 A1* | 3/2018 | Matsumura | G01D 5/24 |
| 2019/0107918 A1 | 4/2019 | Terao | |
| 2022/0260393 A1* | 8/2022 | Al | H03K 17/955 |

FOREIGN PATENT DOCUMENTS

| | | | | |
|---|---|---|---|---|
| CN | 115237286 A | * | 10/2022 | |
| JP | 2013114326 A | * | 6/2013 | |
| JP | 2019-071020 | | 5/2019 | |
| WO | WO-2018203299 A1 | * | 11/2018 | B62D 1/046 |

* cited by examiner

SOLID LINE: AT A TIME OF RELEASING
BROKEN LINE: AT A TIME OF TOUCHING

FIG.17 sub TURN-ON THRESHOLD Th1 CORRECTION

S51A: Noise>NoiseTh1?
- NO → S53A: Th1=InitialTh1+CorrectionTh1 → END
- YES → S52A: TimerN1=0, TimerN2=0

S51B: Noise>NoiseTh2?
- NO → S54B: TimerN1=TimerN1+1 → (loop back to S51B)
- YES → S52B: TimerN2=0

S55B: TimerN1>T2?
- NO → S54C: TimerN2=TimerN2+1
- YES → S56B: TimerN1=T2 → S53B: Th1=InitialTh1+CorrectionTh2 → END S55C: TimerN2>T2?
- NO → (back to S51B)
- YES → S56C: TimerN2=T2, TimerN1=T2 → S57: Th1=InitialTh1 → END

TOUCH DETECTING APPARATUS

CROSS-REFERENCE TO RELATED APPLICATION

The present application is based on and claims priority to Japanese Patent Application No. 2021-118082, filed on Jul. 16, 2021, the entire contents of which are incorporated herein by reference.

BACKGROUND OF THE INVENTION

1. Field of the Invention

The present invention relates to a touch detecting apparatus.

2. Description of the Related Art

In the related art, there is a management apparatus that includes a receiving unit that receives change amount data on a change in capacitance detected by a touch panel from a display device that includes the touch panel of a capacitance type, and a determining unit that determines any of a plurality of operation modes having different thresholds for detecting whether a touch occurs in accordance with the change amount data, and transmits the determination result to the display device (see, for example, Patent Document 1).

CITATION LIST

[Patent Document 1] U.S. Pat. No. 10,761,655 B2

SUMMARY OF THE INVENTION

Technical Problem

However, in the method of determining one of the plurality of operation modes in accordance with the change amount data, it is difficult to detect a touch with high accuracy in an environment where there is noise with respect to capacitance and the noise varies over time.

Therefore, an object of the present invention is to provide a touch detecting apparatus capable of accurately detecting a touch even in an environment in which noise varies.

Solution to Problem

A touch detecting apparatus according to an embodiment of the present invention includes an electrostatic sensor provided on an object; and a touch detecting unit configured to detect whether a hand touches the object based on a capacitance measured by the electrostatic sensor. The touch detecting unit is configured to, in response to the capacitance being greater than or equal to a first touch threshold, detect that the hand touches the object, and, for a second predetermined time from when a change amount of the capacitance during a first predetermined time becomes greater than or equal to a noise threshold, continue a state where a correction value has been added to the first touch threshold.

Advantageous Effects of the Invention

It is possible to provide a touch detecting apparatus that can accurately detect a touch even in an environment where noise varies.

BRIEF DESCRIPTION OF THE DRAWINGS

Other objects, features and advantages of the present invention will become more apparent from the following detailed description when read in conjunction with the accompanying drawings:

FIG. 17 is a flowchart depicting processing with respect to a subroutine "sub turn-on threshold Th1 correction" according to the variant.

DETAILED DESCRIPTION OF THE PREFERRED EMBODIMENTS

Hereinafter, embodiments of a touch detecting apparatus according to the present invention will be described.

Embodiment

Figure 1:
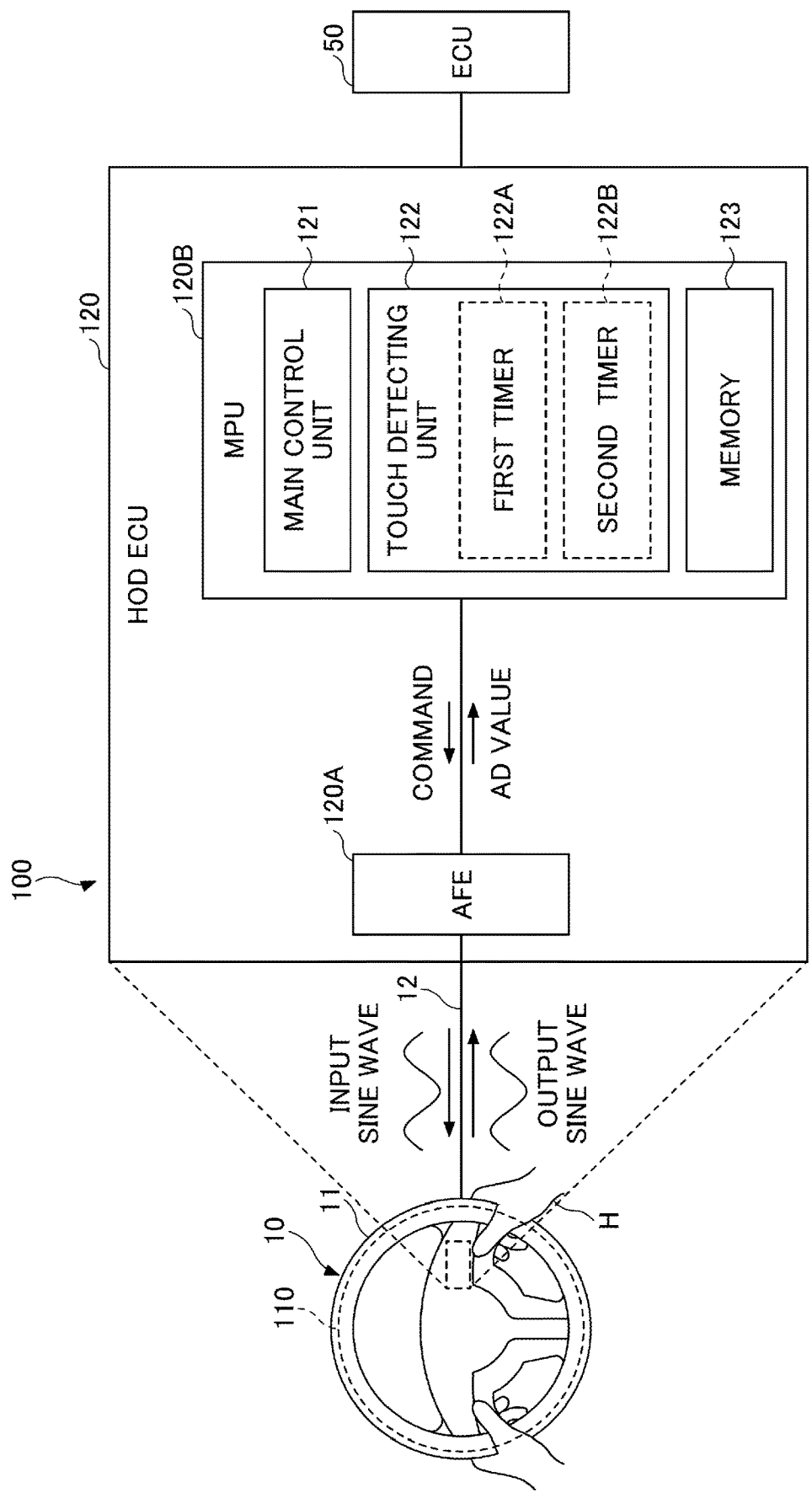
FIG. 1 is a diagram depicting a steering wheel 10 equipped with a touch detecting apparatus 100 according to an embodiment.

FIG. 1 is a diagram depicting a steering wheel 10 equipped with a touch detecting apparatus 100 according to an embodiment. As depicted in FIG. 1, the steering wheel 10 is mounted in a vehicle and an electrostatic sensor 110 of the touch detecting apparatus 100 is mounted inside a grip 11. The grip 11 is an example of an object. The touch detecting apparatus 100 detects whether a driver's hand H touches the grip 11 of the steering wheel 10.

Hereinafter, a driver of the vehicle is referred to as an operator of the touch detecting apparatus 100. The touch detecting apparatus 100 that is capable of detecting whether an operator's hand H, as a to-be-detected body, touches an object in which the electrostatic sensor 110 is provided, will be described. An operator's touching the object provided with the electrostatic sensor 110 is referred to as an operator's operation.

<Configuration of Touch Detecting Apparatus 100>

The touch detecting apparatus 100 includes the electrostatic sensor 110 and a hands off detection electronic control unit (HODECU) 120.

The electrostatic sensor 110 is provided for the entire circle of the grip 11 of the steering wheel 10 and is made of, for example, a metal electrode. The electrostatic sensor 110 is connected to the HODECU 120 via a signal line 12.

The HODECU 120 is provided, for example, inside the steering wheel 10. FIG. 1 depicts the HODECU 120 in a magnified manner. The HODECU 120 includes an analog front end (AFE) 120A and a microprocessor unit (MPU) 120B.

The AFE 120A is connected to the electrostatic sensor 110, inputs a sine wave (input sine wave) to the electrostatic sensor 110 based on a command input from the MPU 120B, and obtains a sine wave (output sine wave) that is output from the electrostatic sensor 110. The AFE 120A obtains a capacitance value (capacitance) of the electrostatic sensor 110 from the input sine wave and the output sine wave, performs analog-to-digital conversion, and performs noise removal using a low pass filter, to output a resulting signal as an AD value to the MPU 120B. The AD value is expressed as a count value without a unit as an example. By thus performing noise removal using the low pass filter, an AD value in which noise at a predetermined frequency or higher is eliminated can be obtained.

The MPU 120B is implemented by a computer including a central processing unit (CPU), a random access memory (RAM), a read-only memory (ROM), an I/O interface, and internal buses. An ECU 50 is connected to the MPU 120B for example. The ECU 50 is a controller for controlling electronic devices of the vehicle in which the steering wheel 10 is provided. The electronic devices may include, for example, electronic devices relating to automatic operation of the vehicle, etc.

The MPU 120B includes a main control unit 121, a touch detecting unit 122, and a memory 123. The main control unit 121 and the touch detecting unit 122 are functional blocks implemented as a result of programs being executed by the MPU 120B. The memory 123 is a functional block representing a memory function of the MPU 120B.

The main control unit 121 is a processing unit that monitors control processing of the MPU 120B and performs processing other than processing performed by the touch detecting unit 122.

The touch detecting unit 122 detects whether a hand H touches the grip 11 by determining whether a difference obtained from subtracting a reference value from a capacitance value of the electrostatic sensor 110 exceeds a threshold. This process is a touch detecting process performed by the touch detecting unit 122. The touch detecting unit 122 provides, to the ECU 50 data indicating the detection result. The reference value is a capacitance value of the electrostatic sensor 110 used by the touch detecting unit 122 to detect whether a hand H touches the grip 11 of the steering wheel 10.

The touch detecting unit 122 includes a first timer 122A and a second timer 122B used in the touch detecting process. The touch detecting process, the first timer 122A, and the second timer 122B will be described later.

Radio waves transmitted by a smartphone or the like may be present in the interior of the vehicle. These waves are noise to the touch detecting apparatus 100. The touch detecting unit 122 performs threshold control to reduce effects of such noise. Details of the threshold control will be described later.

The memory 123 stores the programs and data necessary for the main control unit 121 and the touch detecting unit 122 to perform the processing. The memory 123 stores data indicating a capacitance value of the electrostatic sensor 110, data generated in the processing performed by the touch detecting unit 122, and the like.

<Output Sine Wave of Electrostatic Sensor 110>

Figure 2:
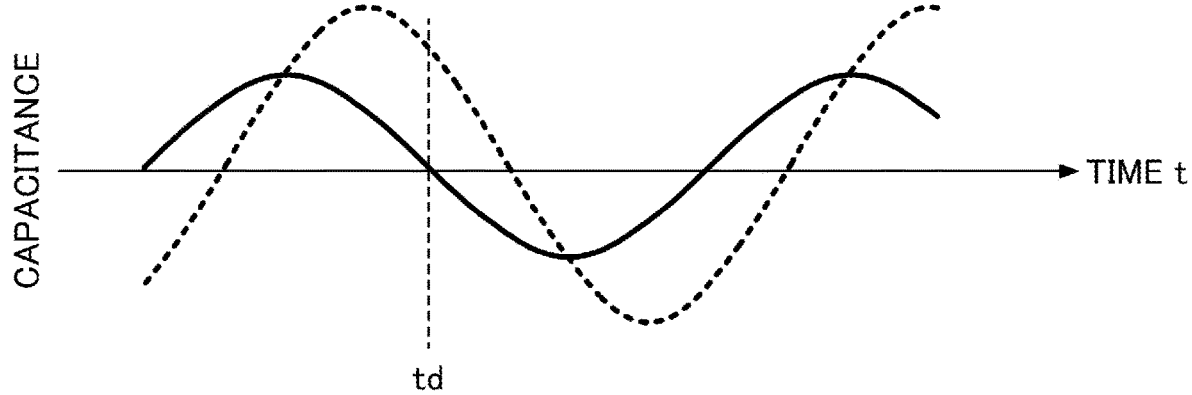
FIG. 2 is a diagram depicting an example of an output sine wave of an electrostatic sensor 110.

FIG. 2 is a diagram depicting an example of an output sine wave of the electrostatic sensor 110. FIG. 2 depicts a solid line of the output sine wave obtained when a hand H is away from the grip 11 (at a time of releasing) and a broken line of the output sine wave obtained when a hand H is holding the grip 11 (at a time of touching).

Because a capacitance value measured by the electrostatic sensor 110 varies when a hand H touches the grip 11 compared to releasing, a sine wave at a time of touching varies in phase and amplitude more compared to a sine wave at a time of releasing. The phase and amplitude of the sine wave at a time of touching vary depending on a degree of touching by the hand H on the grip 11. The degree of touching is, for example, a degree to which the hand H holds the grip 11 lightly or tightly or an area where the hand H touches the grip 11 is narrow or wide.

For example, by predetermining a timing at which the amplitude at a time of releasing becomes zero as a detection timing td, an amplitude AD value corresponding to a degree of touching by a hand H can be measured by detecting the amplitude of the sine wave at the detection timing td. The amplitude AD value at the detection timing td can be regarded as a value corresponding to the degree of touching by the hand H. However, the detection timing td when the amplitude at a time of releasing becomes zero varies due to a change in temperature or the like. Further, the touch detecting apparatus 100 cannot detect whether a hand H is sufficiently away from the electrostatic sensor 110. Therefore, the detection timing td is fixed, and, instead of using the amplitude AD value as is, a correction value is used.

<Detecting Touch Using Reference Value>

Figure 3:
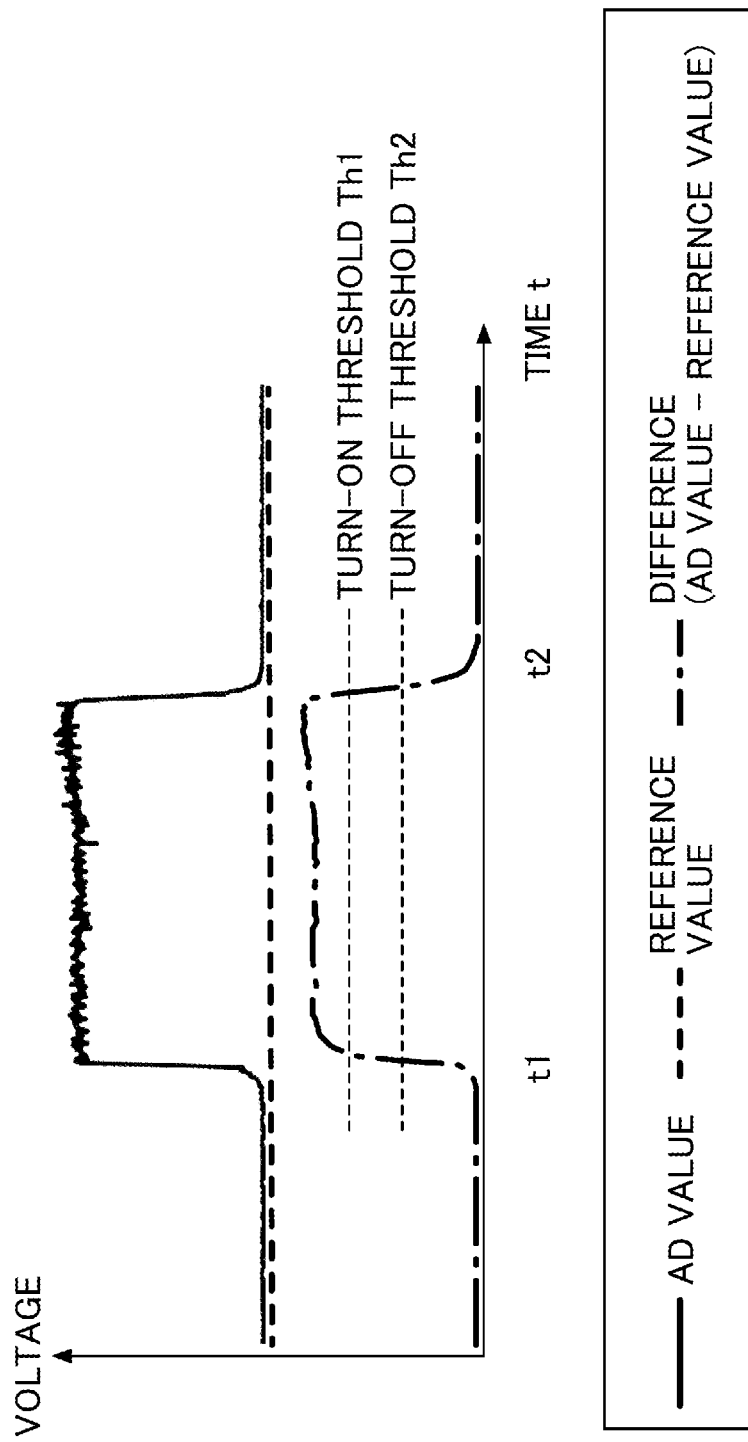
FIG. 3 is a diagram depicting touch detection using a reference value.

FIG. 3 is a diagram depicting a detection of touch a using a reference value. In FIG. 3, a horizontal axis corresponds to a time and a vertical axis corresponds to a voltage. FIG. 3 depicts an amplitude AD value by a solid line, a reference value by a broken line, and a difference ΔAD (AD value–reference value) between the amplitude AD value and the reference value by an alternate long and short dash line. The amplitude AD value is a value output from the AFE 120A. The amplitude AD value indicates the capacitance between the electrostatic sensor 110 and a surrounding conductor. The reference value indicates the capacitance between the electrostatic sensor 110 and the surrounding conductor measured when a hand H is not near the electrostatic sensor 110. The difference ΔAD is the difference of the capacitance between the electrostatic sensor 110 and the surrounding conductor from the capacitance between the electrostatic sensor 110 and the surrounding conductor when a hand H is not near. That is, the difference ΔAD is the capacitance between the electrostatic sensor 110 and a hand H.

In a state prior to a time t1, a hand H is not in touch with the grip 11. When the hand H touches the grip 11 at the time t1, the amplitude AD value rises relative to the reference value. At this time, because the difference (AD value–reference value) rises and becomes greater than or equal to an turn-on threshold Th1, the touch detecting unit 122 detects that the hand H touches the grip 11. The turn-on threshold Th1 is an example of a first touch threshold. When the hand H leaves the grip 11 at a time t2, the amplitude AD value falls. At this time, because the difference (AD value–reference value) also falls, and the difference becomes lower than or equal to a turn-off threshold Th2 that is lower than the turn-on threshold Th1, the touch detecting unit 122 detects that the hand H is away from the grip 11. The turn-off threshold Th2 is an example of a second touch threshold.

<Touch Detecting Process Performed by Touch Detecting Unit 122>

Figure 4:
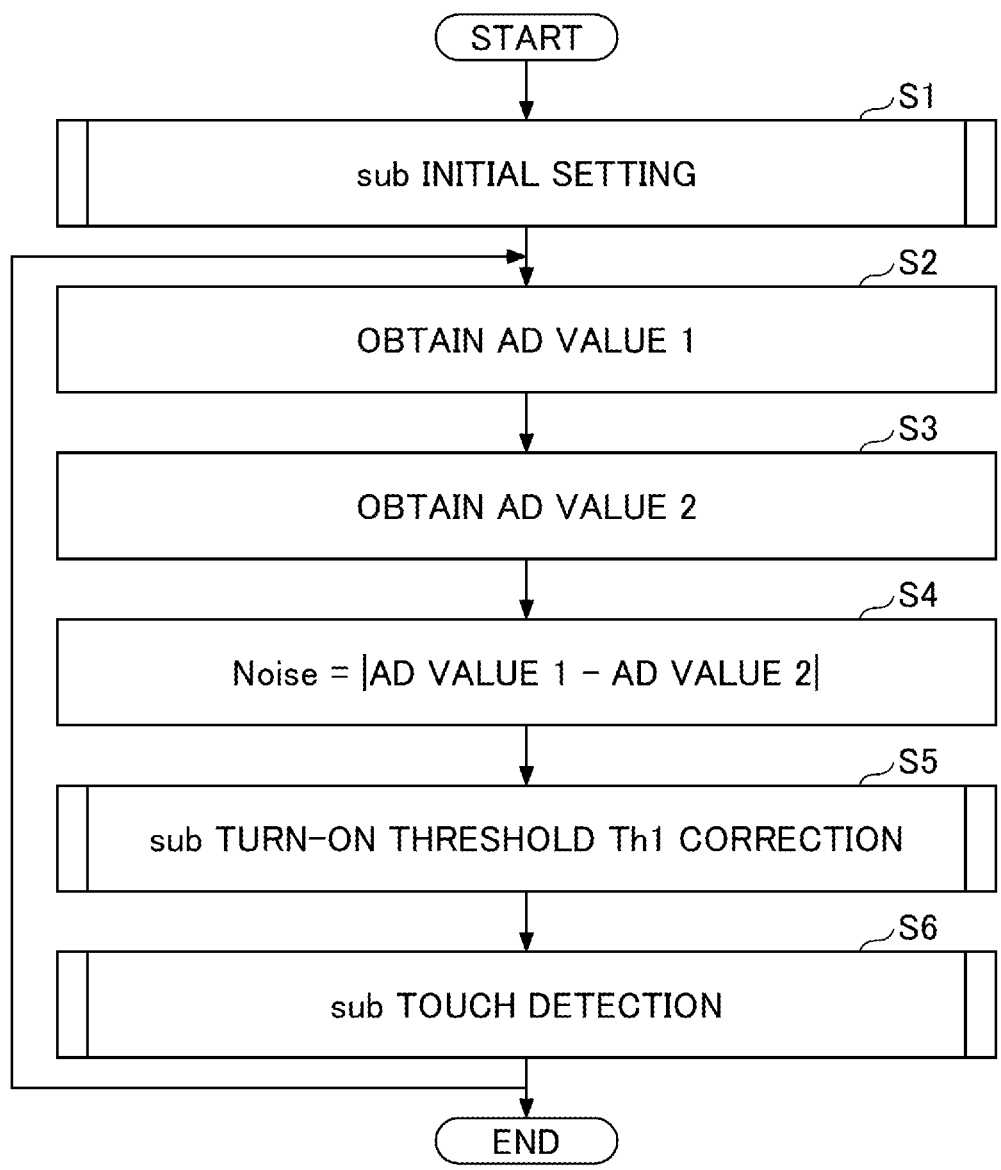
FIG. 4 is a diagram depicting a flowchart illustrating a touch detecting process performed by a touch detecting unit 122.
Figure 5:
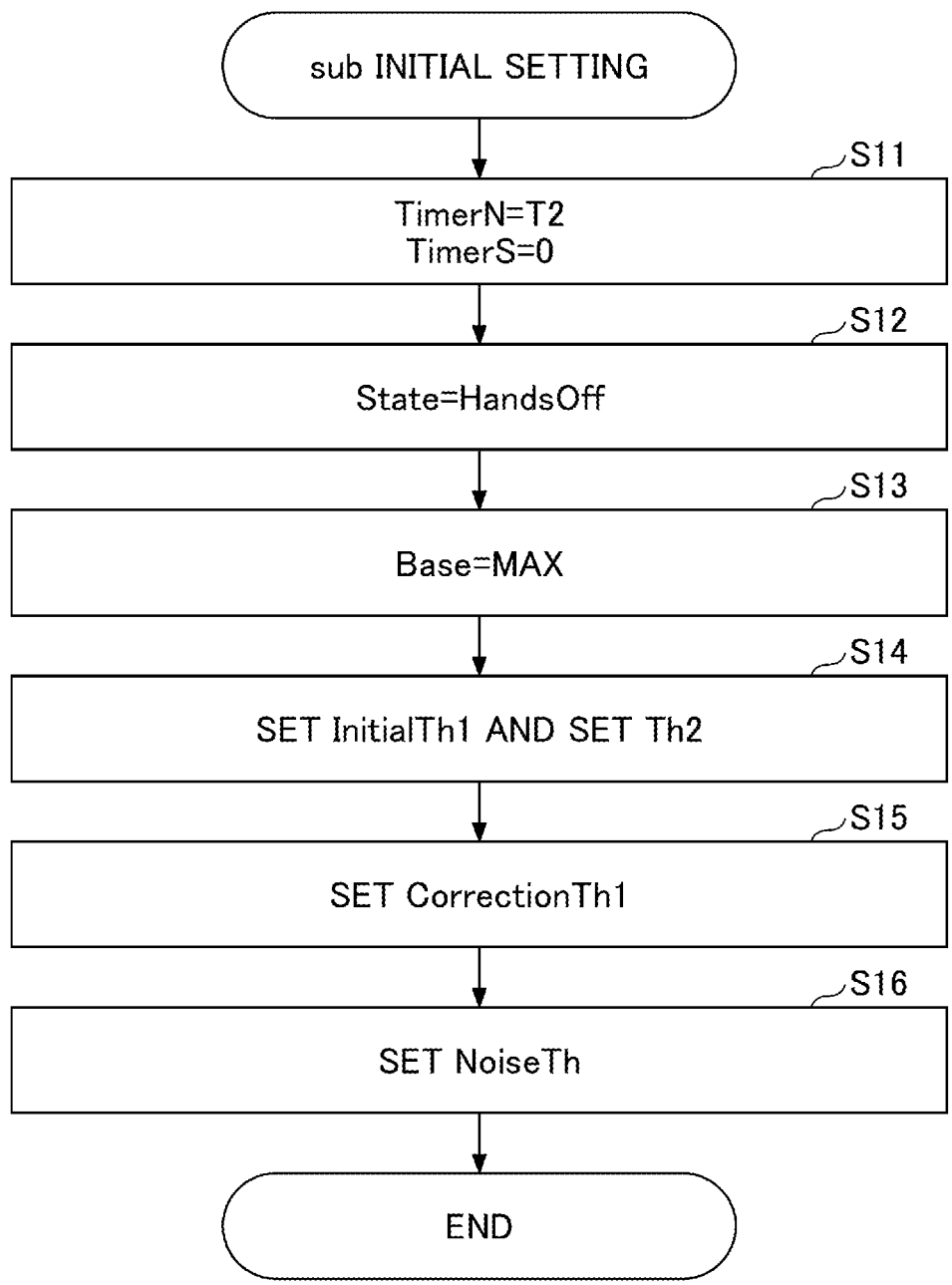
FIG. 5 is a diagram depicting a flowchart illustrating a touch detecting process performed by the touch detecting unit 122.
Figure 6:
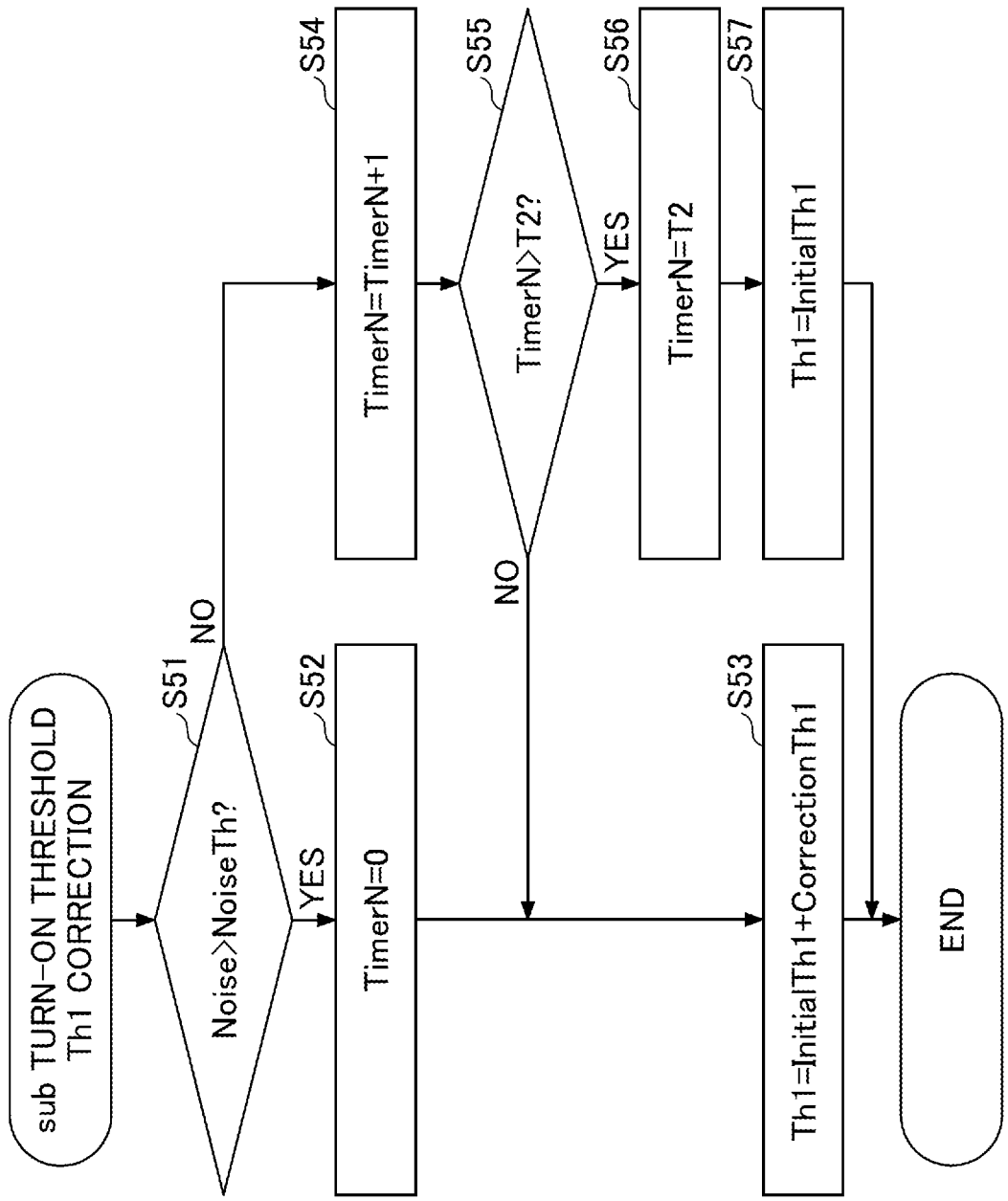
FIG. 6 is a diagram depicting a flowchart illustrating a touch detecting process performed by the touch detecting unit 122.
Figure 7:
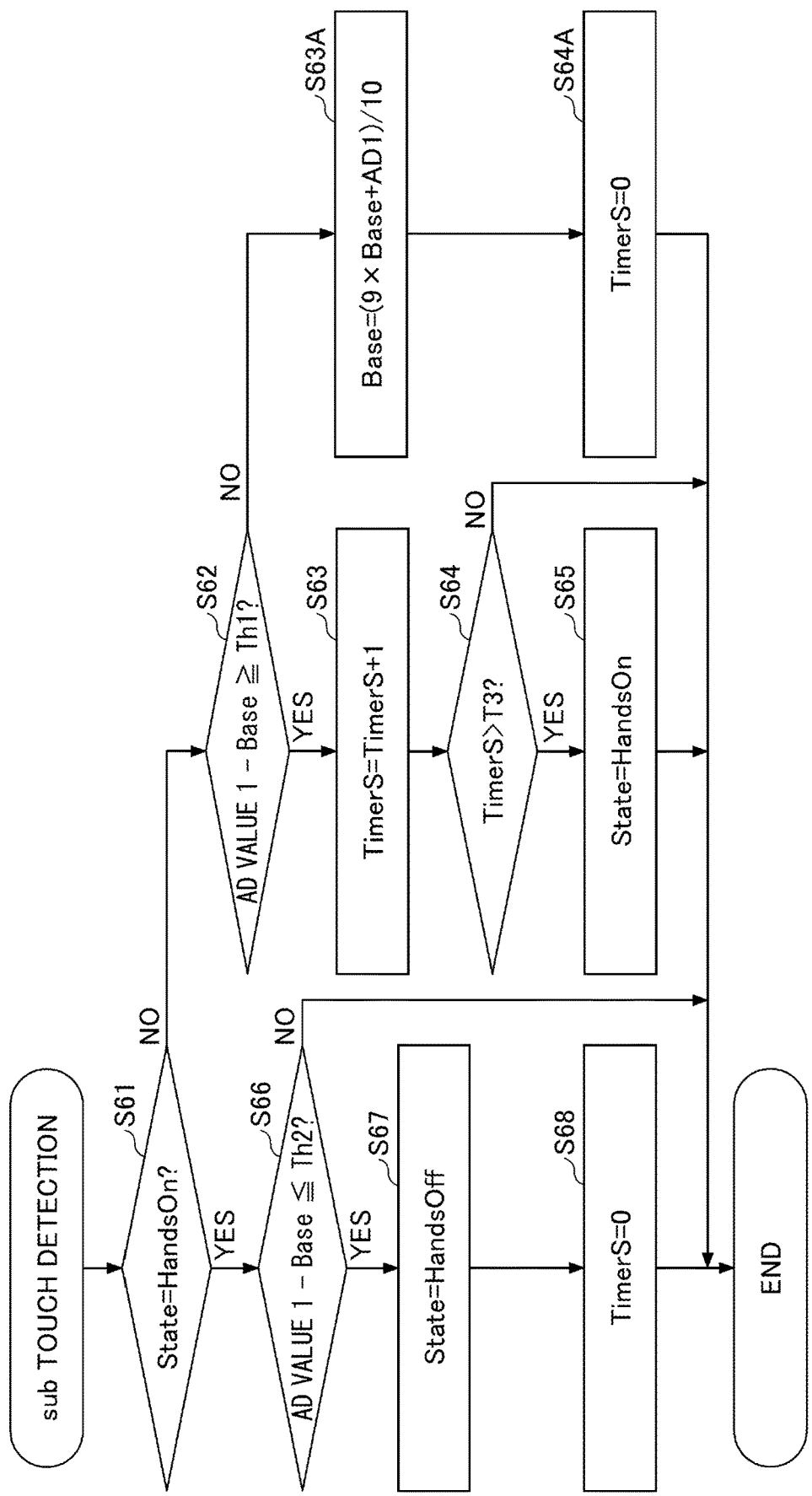
FIG. 7 is a diagram depicting a flowchart illustrating a touch detecting process performed by the touch detecting unit 122.

FIGS. 4 to 7 are diagrams depicting flowcharts depicting touch detecting processes performed by the touch detecting unit 122. These processes are performed by the touch detecting unit 122. FIG. 4 depicts a main flow, and FIGS. 5 to 7 depict subroutine process flows of steps S1, S5, and S6, respectively, of FIG. 4. The main flow of FIG. 4 is executed repeatedly every control cycle of 10 ms, for an example. A touch state "State" is indicated to the ECU 50 by the MPU 120B every 10 ms.

When the processing starts, the touch detecting unit 122 calls a subroutine "sub initial setting" and performs initial setting (step S1). The initial setting is to perform subroutine processing to initialize various values used for subsequent processing. Details are described below with reference to FIG. 5.

In step S2, the touch detecting unit 122 obtains an amplitude AD value 1 from the AFE 120A.

In step S3, the touch detecting unit 122 obtains an amplitude AD value 2 from the AFE 120A when a time T1 has elapsed from when obtaining the amplitude AD value 1. The time T1 is an example of a first predetermined time, for example, a time (period) of about 400 μs to 500 μs. The variation in the amplitude AD value due to a human movement is small over a short period of time ranging from 400 μs to 500 μs. Therefore, as long as the amplitude AD value 1 and the amplitude AD value 2 are obtained with a short period of time in a range between 400 μs and 500 μs elapsing therebetween, it can be regarded that the majority of the change amount is due to noise. That is, the difference (the change amount) between the amplitude AD value 1 obtained in the first measurement and the amplitude AD value 2 obtained in the second measurement with the time T1 elapsing therebetween is regarded as the noise level.

In step S4, the touch detecting unit 122 calculates the absolute value of the difference between the amplitude AD value 1 and the amplitude AD value 2. In an equation or the like, "AD value 1" may be referred to as "AD1" and "AD value 2" may be referred to as "AD2". The absolute value of the difference between the amplitude AD value 1 and the amplitude AD value 2 is |AD value 1–AD value 2|, and is regarded as a quantity representing noise. Hereinafter, a noise amount "Noise" is one obtained from the equation: Noise=|AD value 1–AD value 2|.

In step S5, the touch detecting unit 122 calls the subroutine "sub turn-on threshold Th1 correction" and corrects the turn-on threshold Th1. The touch detecting unit 122 performs subroutine processing for correcting the turn-on threshold Th1 using the noise amount Noise calculated in step S4. Details are described below with reference to FIG. 6.

In step S6, the touch detecting unit 122 calls the subroutine "sub touch detection" and performs touch detection. The touch detecting unit 122 performs subroutine processing for performing the touch detection using the turn-on threshold Th1 corrected in step S5. Details are described below with reference to FIG. 7. When the process of step S6 is completed, the touch detecting unit 122 returns to step S2 and repeats the series of processes.

<Subroutine "Initial Setting">

Next, an initial setting process performed based on the subroutine "sub initial setting" of step S1 in FIG. 4 will be described with reference to FIG. 5.

In step S11, the touch detecting unit 122 sets an initial value of a time count value TimerN of the first timer 122A to T2 and an initial value of a time count value TimerS of the second timer 122B to zero. That is, TimerN=T2 and TimerS=0 are set. The time T2 is an example of a second predetermined time and is stored in the memory 123.

In step S12, the touch detecting unit 122 sets an initial value of the touch state "State" to a not-being-touched state (HandsOff). That is, State=HandsOff is set. The touch state "State" in the initial state is a state in which a hand H is not in touch with the grip 11 of the steering wheel 10.

In step S13, the touch detecting unit 122 sets an initial value of the reference value Base to a maximum value MAX. That is, Base=MAX is set. That is, as an example, in the initial state, the reference value Base is set to the maximum value MAX. The maximum value MAX is stored in the memory 123.

In step S14, the touch detecting unit 122 sets a value InitialTh1 to a predetermined value and sets the turn-off threshold Th2 to a predetermined value. The value InitialTh1 is an initial value of the turn-on threshold Th1. The turn-on threshold Th1 may be increased to become higher than the value InitialTh1 as a result of being corrected, but the turn-off threshold Th2 is a fixed value (constant value). The value InitialTh1 is stored in the memory 123.

In step S15, the touch detecting unit 122 sets a correction value CorrectionTh1 for the turn-on threshold Th1 to a predetermined value. The value of CorrectionTh1 may be determined in advance by, for example, a simulation or an experiment so as to be able to prevent an occurrence of an erroneous detection due to noise.

In step S16, the touch detecting unit 122 sets a noise threshold NoiseTh to a predetermined value. The value of the noise threshold NoiseTh may be determined in advance by, for example, a simulation or an experiment so as to be able to identify noise. When the above-described processing in steps S11 to S16 have been executed, the processing of the subroutine "sub initial setting" ends.

<Subroutine "Sub Turn-on Threshold Th1 Correction">

Next, a correction process for the turn-on threshold Th1 performed based on the subroutine "sub turn-on threshold Th1 correction" of step S5 of FIG. 4 will be described with reference to FIG. 6.

In step S51, the touch detecting unit 122 determines whether the noise amount Noise is greater than the noise threshold NoiseTh, to determine whether there is noise.

In step S52, when the touch detecting unit 122 determines that the noise amount Noise is greater than the noise threshold NoiseTh (S51: Yes), the touch detecting unit 122 resets the first timer 122A. That is, the time count value TimerN of the first timer 122A is set to 0. Accordingly, TimerN=0 is set, and counting with the first timer 122A restarts.

In step S53, the touch detecting unit 122 corrects the turn-on threshold Th1. Specifically, the touch detecting unit 122 adds the correction value CorrectionTh1 to the initial value InitialTh1 of the turn-on threshold Th1. That is, Th1=InitialTh1+CorrectionTh1 is set.

In step S54, when the touch detecting unit 122 determines in step S51 that the noise amount Noise is not greater than the noise threshold NoiseTh (S51: No), the touch detecting unit 122 increments the time count value TimerN of the first timer 122A by 1. That is, TimerN=TimerN+1 is set.

In step S55, the touch detecting unit 122 determines whether the time count value TimerN of the first timer 122A exceeds T2. When the touch detecting unit 122 determines that the time count value TimerN of the first timer 122A does not exceed T2 (S55: No), the processing proceeds to step S53. In a case where a state (i) of noise being generated so that it is determined as Yes in step S51 and a state (ii) of there being no noise so that it is determined as No in step S51 are alternately repeated continuously, a state where the correction value CorrectionTh1 has been added to the turn-on threshold Th1 in step S53 continues until the time count value TimerN of the first timer 122A exceeds T2. Thus, it is possible to ensure high accuracy touch detection even in noise varying environments.

In step S56, when the touch detecting unit 122 determines in step S55 that the time count value TimerN exceeds T2 (S55: Yes), the touch detecting unit 122 returns the time count value TimerN of the first timer 122A to T2. If a state where there is no noise continues, repetition of the time count value TimerN being added by 1 in step S54 continues. Therefore, the time count value TimerN is returned to T2 to avoid digit overflow.

In step S57, when a period during which noise is small is T2 or longer, the touch detecting unit 122 sets the turn-on threshold Th1 to the initial value InitialTh1. Returning the turn-on threshold Th1 to the initial InitialTh1 is to end continuing a state where the correction value CorrectionTh1 has been added to the turn-on threshold Th1. When steps S51 to S57 have been thus executed, the subroutine "sub turn-on threshold Th1 correction" ends.

<Subroutine "Sub Touch Detection">

Next, a touch detecting process performed based on the subroutine "sub touch detection" of step S6 in FIG. 4 will be described with reference to FIG. 7.

In step S61, the touch detecting unit 122 determines whether the touch state "State" in the immediately preceding control cycle is a being-touched state (HandsOn). Because the control cycle is 10 ms, the touch state "State" in the immediately preceding control cycle indicates the detection result obtained 10 ms before.

In step S62, when the immediately preceding state is not a being-touched state (HandsOn) (S61: No), the touch detecting unit 122 determines whether the difference ΔAD obtained by subtracting the reference value Base from the amplitude AD value 1 is greater than or equal to the turn-on threshold Th1. The turn-on threshold Th1 is used to detect whether a touch occurs. The amplitude AD value 1 indicates the capacitance between the electrostatic sensor 110 and the surrounding conductor. The reference value Base indicates the capacitance between the electrostatic sensor 110 and the surrounding conductor in the absence of a hand H. The difference ΔAD indicates the capacitance between the electrostatic sensor 110 and a hand H.

In step S63, when it is determined that the difference ΔAD is greater than or equal to the turn-on threshold Th1 (S62: Yes), the touch detecting unit 122 increments the time count value TimerS of the second timer 122B by 1. That is, TimerS=TimerS+1 is set.

In step S64, the touch detecting unit 122 determines whether the time count value TimerS of the second timer 122B exceeds T3. T3 is an example of a third predetermined time. This is for the purpose of detecting that a hand H is in touch with the grip 11 of the steering wheel 10 in response to the difference ΔAD continuously exceeding the turn-on threshold Th1 for some amount of a period of time T3 instead of detecting that a hand H is in touch with the grip 11 of the steering wheel 10 immediately in response to the difference ΔAD exceeding the turn-on threshold Th1. Therefore, when it is determined that the time count value TimerS does not exceed T3 (S64: No), the touch detecting unit 122 ends the process of FIG. 7. Upon completion of the subroutine "sub touch detection", step S2 of FIG. 4 is returned to.

Detecting that a touch occurs in response to a difference ΔAD continuously exceeding the turn-on threshold Th1 for some amount of a period of time T3 ensures the stability of switching a detected touch state "State" from a not-being-touched state to a being-touched state. When a large noise component is added to a difference ΔAD, the difference ΔAD may exceed a turn-on threshold Th1 even if a hand H is not in touch with the grip 11 of the steering wheel 10. However, because noise varies, it is rare for a large noise component to be successively added to a difference ΔAD a plurality of times. When an amplitude AD value 1 and an amplitude AD value 2 obtained after the time T1 are subject to noise of the same magnitude, it is erroneously determined that the noise level is small. In this case, a turn-on threshold Th1 may be set to be too low and a differential ΔAD may exceed the turn-on threshold Th1 even though a hand H is not in touch with the grip 11 of the steering wheel 10. However, because noise varies, it is rare for an amplitude AD value 1 and an amplitude AD value 2 obtained after the time T1 to continue to be added by approximately the same amount of a large noise component. Therefore, by detecting that a touch occurs in response to a difference ΔAD exceeding a turn-on threshold Th1 continuously for some amount of a period of time T3, it is possible to avoid an erroneous detection.

In step S65, when determining that the time count value TimerS exceeds T3 (S64: Yes), the touch detecting unit 122 sets the touch state "State" to a being-touched state (HandsOn). After the completion of step S65, the touch detecting unit 122 ends the process. Upon completion of the subroutine "sub touch detection", step S2 of FIG. 4 is returned to.

In step S63A, when determining in step S62 that the difference ΔAD is smaller than the turn-on threshold Th1 (S62: No), the touch detecting unit 122 updates the reference value Base. Specifically, the reference value Base is updated by calculating a weighted average using the amplitude AD value 1 obtained at that time. If the difference ΔAD is smaller than the turn-on threshold Th1, a hand H is not near the electrostatic sensor 110. The reference value Base varies depending on the temperature or the like. The weighted average value with respect to the amplitude AD value 1 is set as the reference value Base when a hand H is not near the electrostatic sensor 110. For example, the following equation is used to calculate the weighted average in a case where the weight is 9: Base=(9×Base+AD1)/10

In step S64A, the touch detecting unit 122 resets the time count value TimerS of the second timer 122B. That is, TimerS=0 is set, and time counting in the second timer 122B restarts. After the completion of step S64A, the touch detecting unit 122 ends the process. Upon completion of the subroutine "sub touch detection", step S2 of FIG. 4 is returned to.

In step S66, the touch detecting unit 122 determines whether the difference ΔAD obtained by subtracting the reference value Base from the amplitude AD value 1 is smaller than or equal to the turn-off threshold Th2 in a case where, in step S61, the immediately preceding detection indicates a being-touched state (HandsOn) (S61: Yes).

When determining that the difference ΔAD is greater than the turn-off threshold Th2 (S66: No), the touch detecting unit 122 ends the process. Upon completion of the subroutine "sub touch detection", step S2 of FIG. 4 is returned to. In this case, a state where it is detected that a touch occurs continues.

In step S67, when determining in step S66 that the difference ΔAD is smaller than or equal to the turn-off threshold Th2 (S66: Yes), the touch detecting unit 122 detects that the touch state "State" is a not-being-touched state (HandsOff). That is, State=HandsOff is set.

When a touch state "State" is to be switched from a not-being-touched state to a being-touched state, the touch detecting unit 122 waits until the time count value TimerS of the second timer 122B exceeds T3 in a state in which it is detected that a touch occurs (see step S64). In contrast thereto, switching from a being-touched state to a not-being-touched state is caused immediately. This is because, if a hand H is away from the grip 11 of the steering wheel 10, the ECU 50 needs to be indicated this fact immediately for safety reasons.

In step S68, the touch detecting unit 122 resets the time count value TimerS of the second timer 122B. That is, TimerS=0 is set, and time counting in the second timer 122B restarts. After step S69, the touch detecting unit 122 ends the process. Upon completion of the subroutine "sub touch detection", step S62 is returned to.

<Operations of Touch Detecting Apparatus 100 According to Embodiment>

FIGS. 8 to 11 are diagrams depicting operations of the touch detecting apparatus 100 according to the embodiment. In FIGS. 8 to 11, the horizontal axis corresponds to time (no units).

Figure 8:
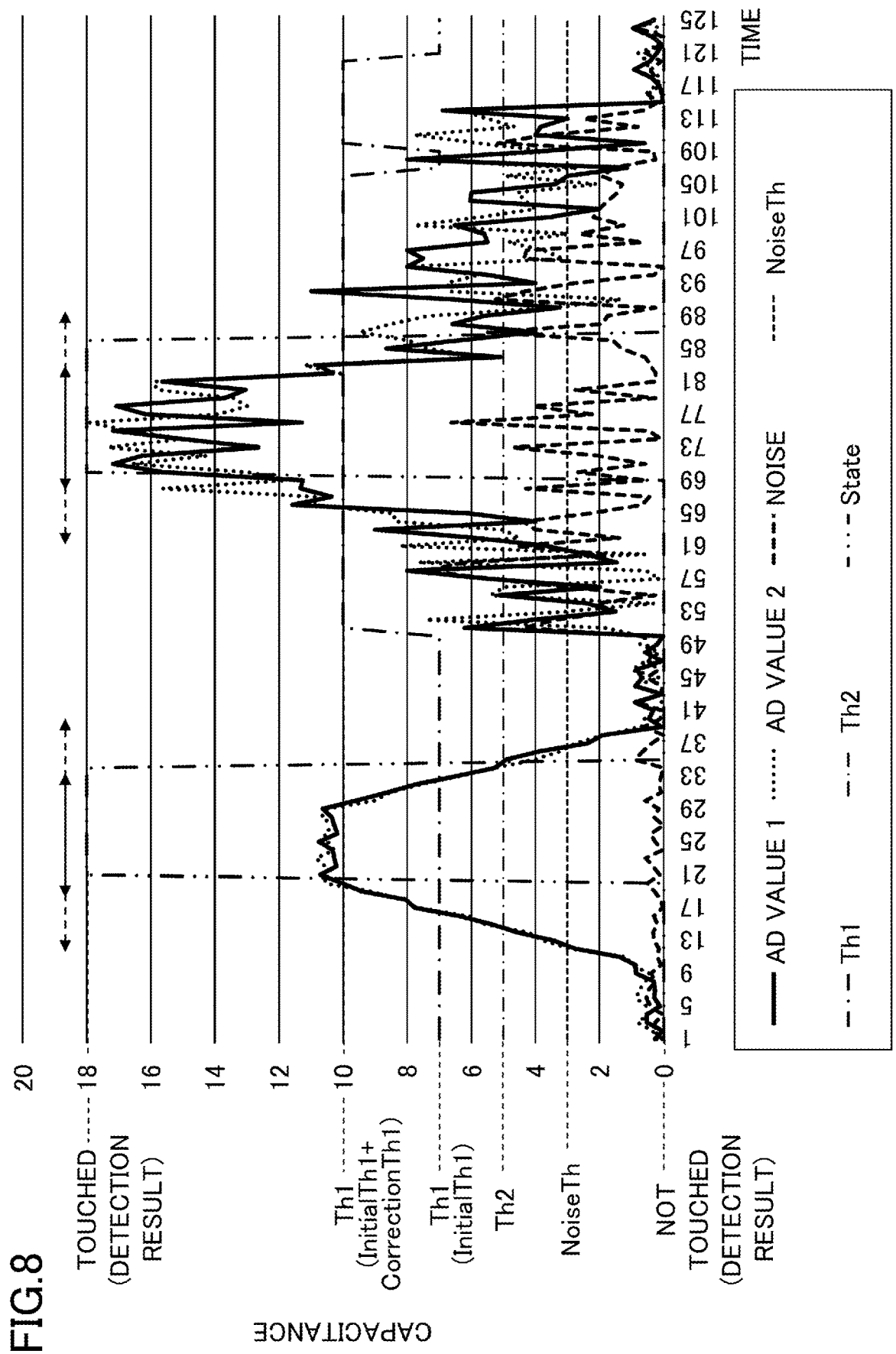
FIG. 8 is a diagram depicting operations of the touch detecting apparatus 100 according to the embodiment.
Figure 9:
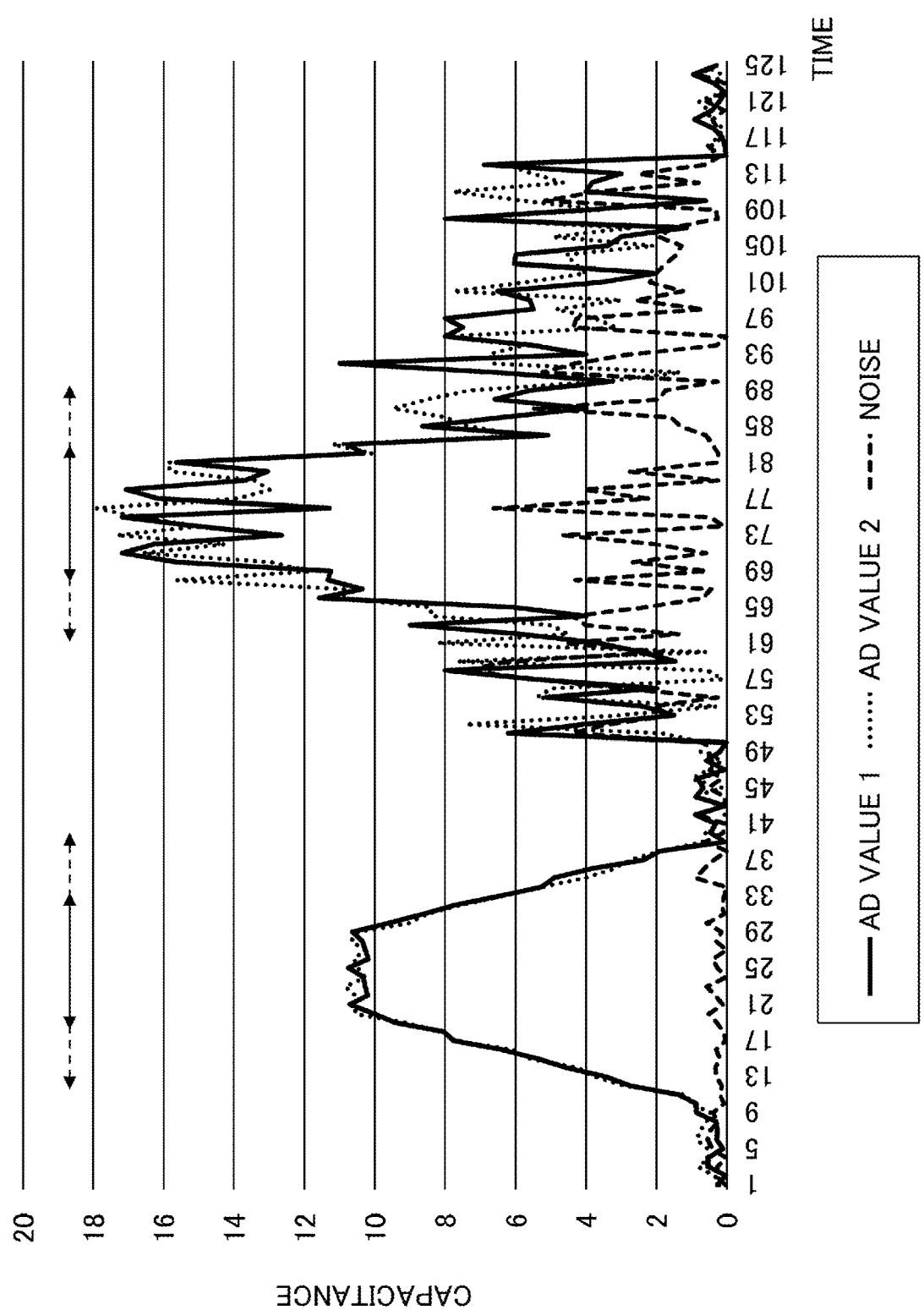
FIG. 9 is a diagram depicting operations of the touch detecting apparatus 100 according to the embodiment.
Figure 10:
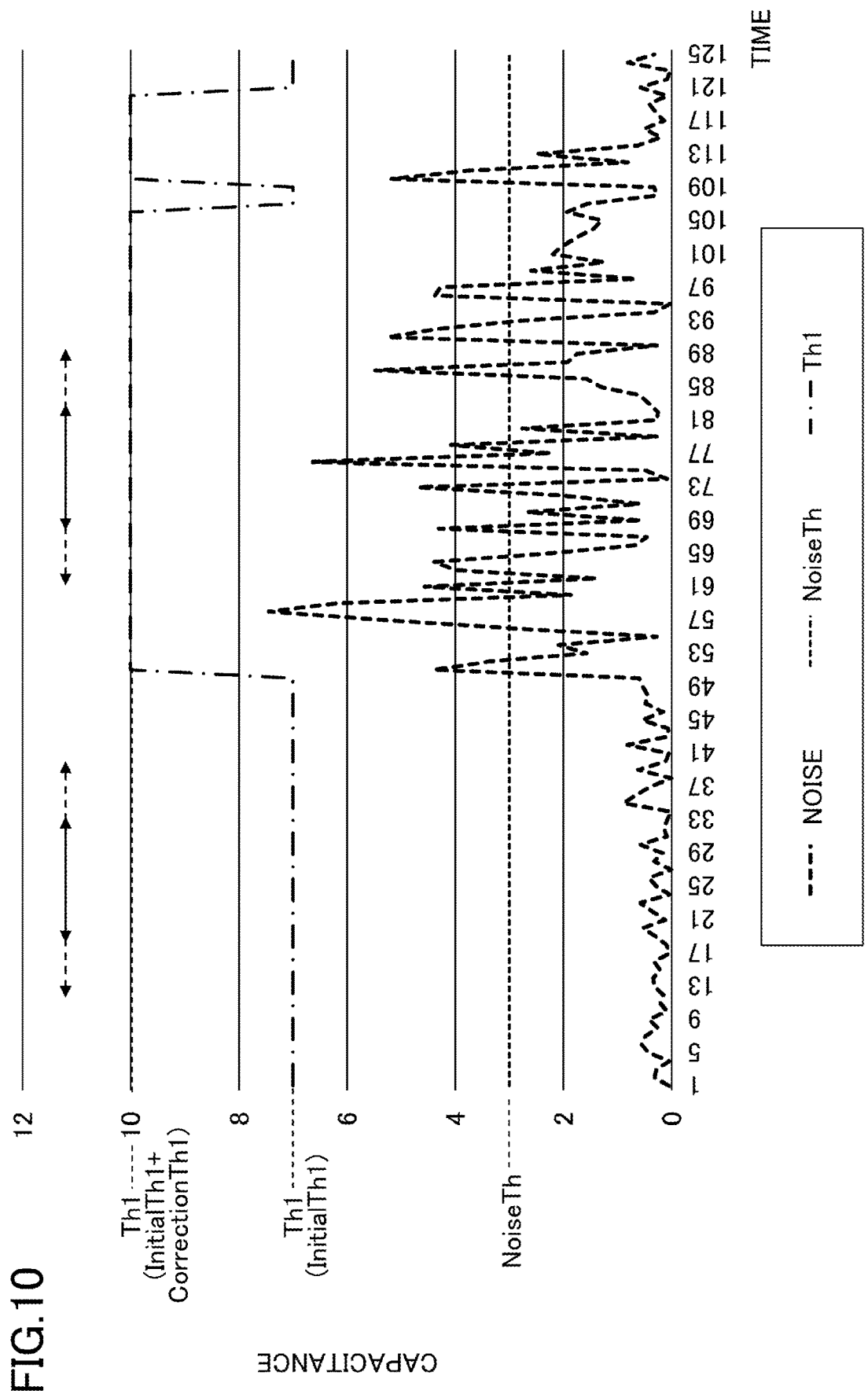
FIG. 10 is a diagram depicting operations of the touch detecting apparatus 100 according to the embodiment.
Figure 11:
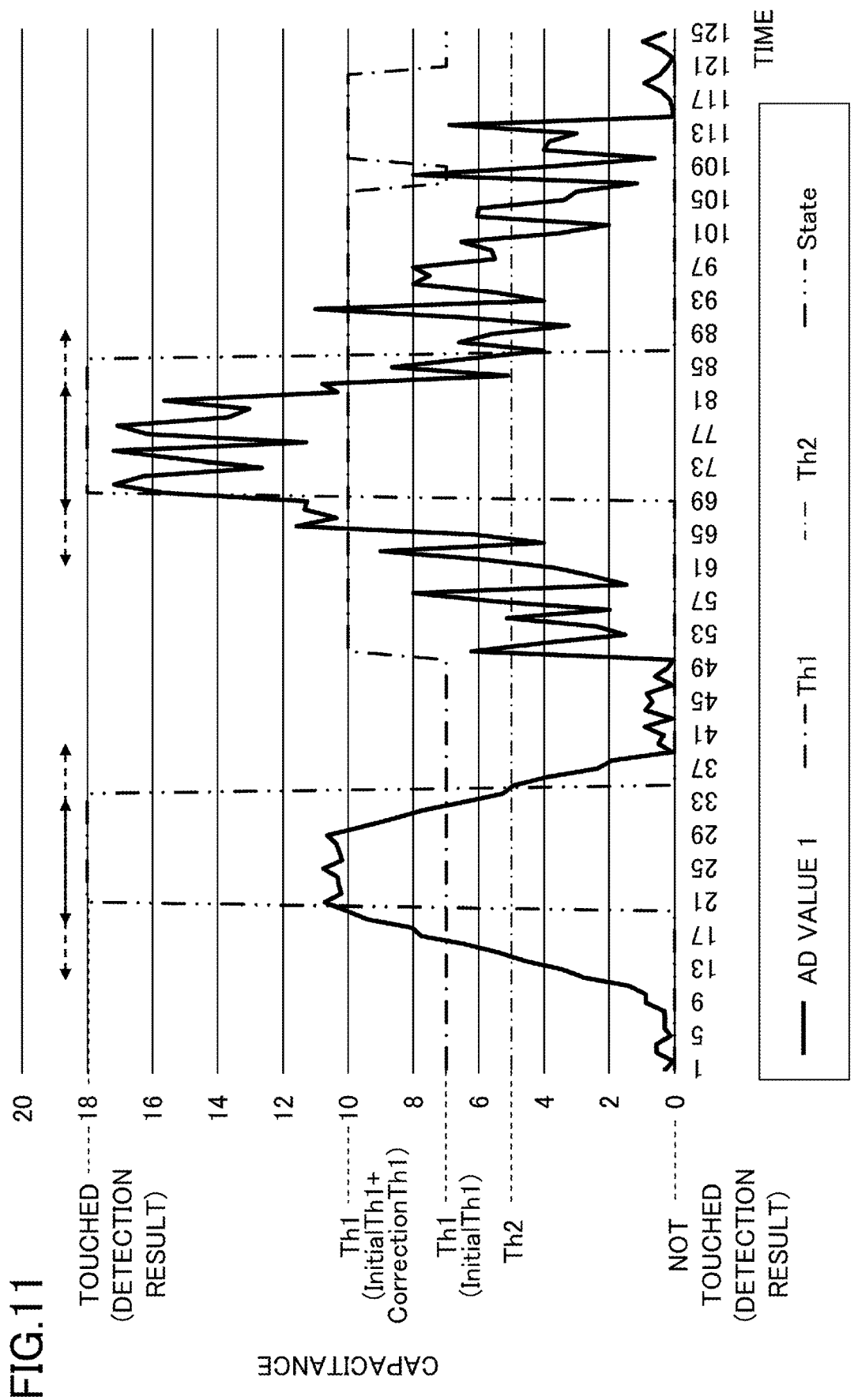
FIG. 11 is a diagram depicting operations of the touch detecting apparatus 100 according to the embodiment.

FIG. 8 depicts an amplitude AD value 1, an amplitude AD value 2, noise, a noise threshold NoiseTh, a turn-on threshold Th1, a turn-off threshold Th2, and a touch state "State". FIG. 9 depicts an amplitude AD value 1, an amplitude AD value 2, and noise. FIG. 10 depicts noise, a noise threshold NoiseTh, and a turn-on threshold Th1. FIG. 11 depicts an amplitude AD value 1, a turn-on threshold Th1, a turn-off threshold Th2, and a touch state "State". However, noise in FIG. 8 does not depict an actual noise component. Noise in FIG. 8 is a value calculated from |amplitude AD value 1−amplitude AD value 2|.

The solid-line double-ended arrows and broken-line arrows depicted at the top of FIGS. 8 to 11 depict actual hand H movements. The time periods indicated by the solid-line double-ended arrows are time periods in which the grip 11 is held by a hand H. The time periods indicated by the broken-line arrows in front of the time periods of the solid-line double-ended arrows are time periods in which the grip 11 is close to being held by the hand H. The time periods indicated by the broken-line arrows after the time periods of the solid-line double-ended arrows are time periods in which the hand H is close to being removed from the grip 11.

The actual movement of the hand H is such that, first, a not-being-touched state occurs where the hand H is not in touch with the grip 11, thereafter the hand comes to be in touch with the grip 11, and again, the hand H is removed from the grip 11, thus a not-being-touched state occurring again. Thus, after noise is generated, the hand H comes to be in touch with the grip 11, and again, the hand H is removed from the grip 11, thus a not-being-touched state occurring again. Whether touch state "State" detection results provided by the touch detecting apparatus 100 agree to these actual movements of the hand H will now be described.

During the time period from time 1 to time 51, noise is small. During the time period from time 1 to time 51, the measured noise (=|AD value 1−AD value 2|) is sufficiently small. The turn-on threshold Th1 is set to InitialTh1 for the time period during which the state where the measured noise is small continues. At time 11, the hand H begins to hold the grip. Accordingly, the amplitude AD value 1 increases. At time 17, the amplitude AD value 1 becomes greater than or equal to the turn-on threshold Th1. In the present example, the reference value Base is set to 0. That is, the capacitance ΔAD between the electrostatic sensor 110 and the hand H calculated by subtracting the reference value Base from the amplitude AD value 1 is equal to the amplitude AD value 1. Then, at time 21, the touch state "State" switches to a being-touched state. In this regard, the time period (5) from time 17 when the amplitude AD value 1 (difference ΔAD) becomes greater than or equal to the turn-on threshold Th1 to time 21 when the touch state "State" switches to the being-touched state corresponds to a time T3.

At time 30, the hand H begins to leave the grip 11. As a result, the amplitude AD value 1 starts decreasing. At time 35, the AD value 1 (=difference ΔAD) becomes smaller than or equal to the turn-off threshold Th2. At this time, the touch state "State" is immediately switched to a not-being-touched state.

When noise increases at time 51 and exceeds the noise threshold NoiseTh, the turn-on threshold Th1 is corrected and thus the correction value CorrectionTh1 is added. The turn-on threshold Th1 thus increases to InitialTh1+CorrectionTh1. After time 51, increased noise is added to the amplitude AD.

The AD value 1 exceeds the Initial Th1 at time 58 and time 63, but the turn-on threshold Th1 has been increased by the correction, so that the touch state "State" does not change to a being-touched state at these points in time.

At time 65, the amplitude AD value 1 exceeds the turn-on threshold Th1. At time 70 when a time T3 (5) has elapsed from the point in time, the touch state "State" switches to a being-touched state.

From time 80, the hand begins to leave the grip 11. As a result, the amplitude AD value 1 starts decreasing. The amplitude AD value 1 becomes smaller than or equal to the turn-off threshold Th2 at time 87. At this time, the touch state "State" immediately switches to a not-being-touched state.

Actually, there is large noise between times 51 and 114. However, when noise of approximately the same magnitudes are added to the AD value 1 and the AD value 2, the measured noise becomes smaller than the noise threshold NoiseTh at a certain point in time. However, in a case where large noise is generated, noise of approximately the same magnitudes being repetitively added to the AD value 1 and the AD value 2 continuously, rarely occurs. Therefore, the turn-on threshold Th1 continues being in the state where the correction value has been added thereto.

At time 98, the measured noise becomes smaller than the noise threshold NoiseTh, and at time 107 at which a time T2 has been exceeded, the turn-on threshold Th1 is returned to InitialTh1. The turn-on threshold Th1 has been set to InitialTh1 during a period from time 107 to time 109. Actually, there is large noise between times 51 and 114. That is, during the time period from time 107 to time 109, the turn-on threshold Th1 has been set low relative to the actual noise level.

As described above, the turn-on threshold Th1 has been set low relative to the actual noise level between times 107 and 109. Further, at time 108, the amplitude AD value 1 becomes greater than or equal to the turn-on threshold Th1 due to the noise. However, because a state in which the amplitude AD value 1 is greater than or equal to the turn-on threshold Th1 due to the noise does not continue for a period of time T3, the touch state "State" is kept in a not-being-touched state. Because noise has a random magnitude, measured noise |AD value 1−AD value 2| may frequently have a value smaller than the actual noise. However, because noise has a random magnitude, measured noise |AD value 1−AD value 2| rarely continues having a value smaller than the actual noise. As described above, there is a large noise between times 51 and 114. During this interval, the measured noise is reduced a plurality of times. However, the duration for which the measured noise is continuously small is limited to the period between time 98 and time 109. When the measured noise is small 10 times continuously, the turn-on threshold Th1 is set low. As a result, the time period for which the turn-on threshold Th1 has been set low with respect to the actual noise level is limited to the period between times 107 and 109. During the period between times 107 and 109, a case where the amplitude AD value 1 becomes greater than or equal to the turn-on threshold Th1 due to noise is limited to time 108. When the amplitude AD value 1 becomes greater than or equal to the turn-on threshold Th1 five times continuously, it is detected that a hand H holds the grip. Therefore, in the example of FIG. 8, when a hand H is not holding the grip 11, it is not erroneously detected that a hand H is holding the grip 11. Even if large noise is continuously generated while a hand H is not holding the grip 11, it rarely occurs that noise is continuously measured as being low and the amplitude AD value 1 is continuously measured as being high. That is, even when noise has a large amount, it is extremely rare that noise components of the amplitude AD value 1 and the amplitude AD value 2 continue being approximately at the same levels and having large amounts. Accordingly, it is very unlikely that noise causes an erroneous detection that a hand H holds the grip 11 even though a hand H is not actually holding the grip 11. It is noted that it is time-consuming for detecting that a hand H holds the grip 11 from when the hand H actually holds the grip 11. In this regard, for such touch detecting apparatuses for detecting a hand's touch to a steering, it is permissible to take a little time to detect that the steering is held by a hand.

Thereafter, when noise exceeds the noise threshold NoiseTh at time 110, the turn-on threshold Th1 is again increased. When noise becomes smaller than or equal to the noise threshold NoiseTh at time 112 and a time T2 has been exceeded, the turn-on threshold Th1 is returned to the initial value InitialTh1 at time 121. It is noted that the actual noise reduction occurs at time 115 in the example of FIG. 8.

Thus, when noise is detected, the correction value CorrectionTh1 is added to the turn-on threshold Th1, and thus, an erroneous detection is avoided. Also, after noise is detected, a state where the correction value CorrectionTh1 has been added to the turn-on threshold Th1 continues for a certain period of time, and thus, an erroneous detection is avoided. In addition, a touch is detected after a state in which an amplitude AD value 1 (=capacitance ΔAD) has become greater than or equal to the turn-on threshold Th1 continues for a certain period of time, and thus, an erroneous detection is avoided. That is, touching or not-touching of a hand H to the grip 11 of the steering wheel 10 can be accurately detected.

When a change amount (Noise) of an AD value during a time T1 becomes greater than or equal to the noise threshold NoiseTh, the touch detecting unit 122 adds the correction value CorrectionTh1 to a turn-on threshold Th1 and starts time counting in the first timer 122A. When a state where a change amount of an AD value during a time T1 (Noise) is smaller than the noise threshold NoiseTh continues and the time count value TimerN of the first timer 122A exceeds a time T2, the state where the correction value CorrectionTh1 has been added to the turn-on threshold Th1 is ended. Thus, it is possible to avoid an erroneous detection due to noise by continuing a state where the correction value CorrectionTh1 has been added to the turn-on threshold Th1 from when a change amount (Noise) in an AD value during a time T1 becomes greater than or equal to the noise threshold NoiseTh to when a state where a change amount (Noise) in an AD value during a time T1 being smaller than the noise threshold NoiseTh has been continued for a time T2. Noise cannot be measured directly. In the present embodiment, the difference between two amplitude AD values 1 and 2 measured at a short interval is regarded as a noise level. Therefore, when the two amplitude AD values 1 and 2 have noise components having approximately the same amounts, the noise level is measured as being smaller than the actual noise level. However, when large noise is generated, it is unlikely that approximately the same amounts of noise are continuously added to two amplitude AD values 1 and 2. Therefore, the present embodiment can avoid an erroneous detection due to noise.

When a change amount (Noise) during a time T1 of an AD value becomes greater than or equal to the noise threshold NoiseTh before a time count value TimerN of the first timer 122A exceeds a time T2, the touch detecting unit 122 resets the first timer 122A and causes the first timer 122A to restart counting. This process occurs in FIG. 6, when, after having progressed through steps S51:No→S54→S55:No→S53 and returning to the main routine, the process returns to step S51 and progresses through steps S51:Yes→S52. As described above, when a change amount (Noise) during a time T1 of an AD value becomes greater than or equal to the noise threshold NoiseTh before a time count value TimerN exceeds a time T2, a time count value TimerN of the first timer 122A is reset, so that a state where the correction value CorrectionTh1 has been added to a turn-on threshold Th1 is made to continue for a time T2 from the point in time to avoid an erroneous detection due to noise.

In addition, when a state where a capacitance ΔAD (=AD value 1−reference value) is greater than or equal to the turn-on threshold Th1 continues for a time T3, the touch detecting unit 122 detects that a hand H touches the grip 11. Therefore, the stability for when a touch state "State" is switched from a not-being-touched state to a being-touched state can be guaranteed, and it can be stably detected that a hand H is in touch with the grip 11. In a noisy environment, a capacitance ΔAD may be measured as having a large amount even if a hand H is not in touch with the grip 11. However, because noise fluctuates, it is rare for a large noise component to continue being added to a capacitance ΔAD. Therefore, an erroneous detection due to noise can be avoided.

When ΔAD (=AD value 1−reference value) becomes below the turn-off threshold Th2, the touch detecting unit 122 immediately detects that a hand H is not in touch with the grip 11. Therefore, when a hand H is removed from the grip 11 of the steering wheel 10, the touch detecting unit 122 can immediately indicate the detection result to the ECU 50 for safety purposes. This ensures safety in running of the vehicle.

Further, because the turn-on threshold Th1 is greater than the turn-off threshold Th2, hysteresis characteristics can be provided when a touch state "State" is switched from a not-being-touched state to a being-touched state and when a touch state is switched from a being-touched state to a not-being-touched state, and thus, the touch state can be detected stably.

<Operations of Touch Detecting Apparatus for Comparison>

FIGS. 12 to 15 are diagrams depicting operations of a touch detecting apparatus for comparison. In FIGS. 12 to 15, the horizontal axis corresponds to time (no units). The touch detecting apparatus for comparison differs from the touch detecting apparatus 100 according to the embodiment in that the turn-on threshold Th1 is a fixed value without being corrected and a touch state "State" is immediately switched to a being-touched state when an amplitude AD value 1 becomes greater than or equal to the turn-on threshold Th1. An amplitude AD value 2 for noise measurement is not measured, and there is no AD value 2. Actual operations of a hand H are identical to the operations of FIGS. 8 to 11.

Figure 12:
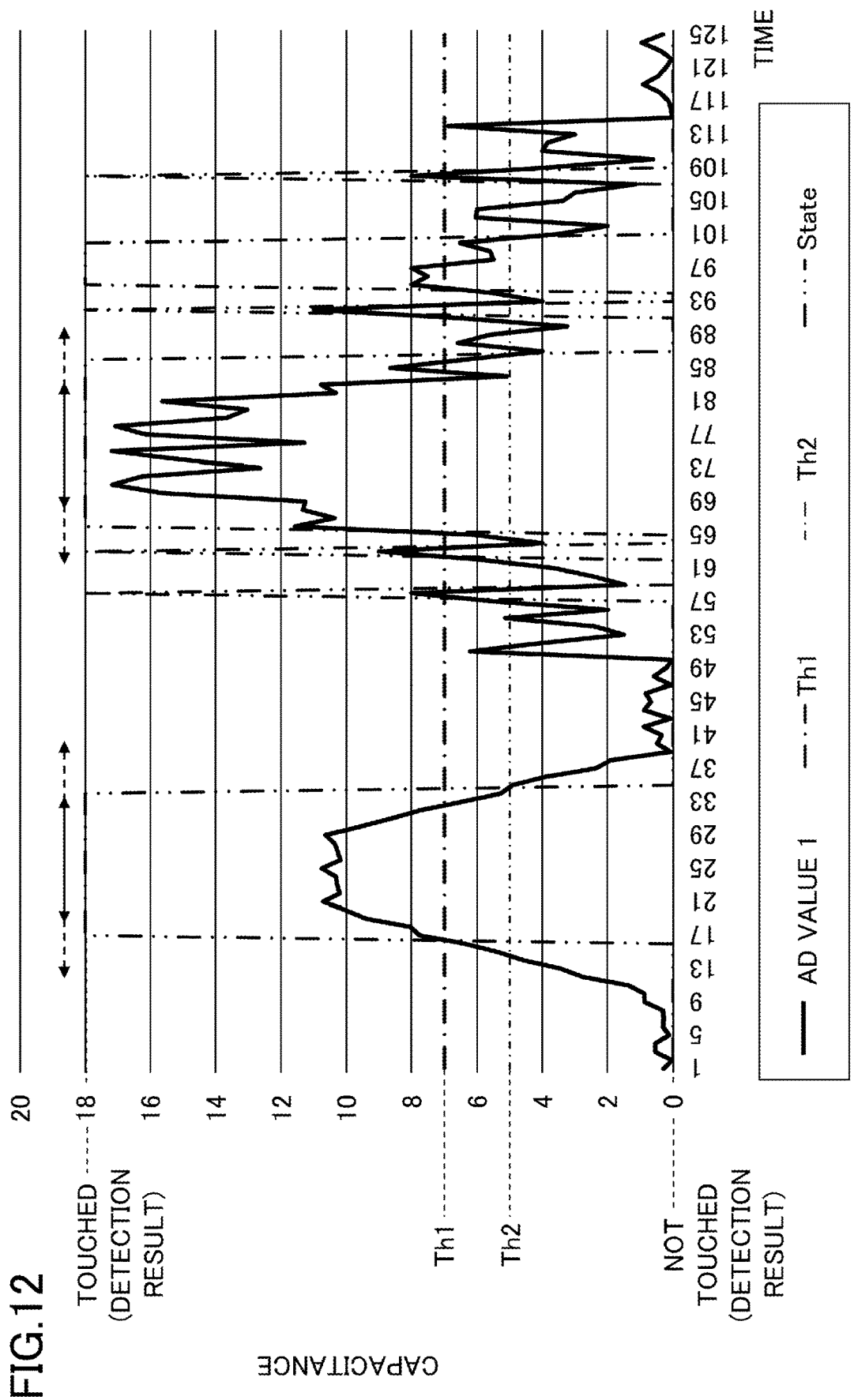
FIG. 12 is a diagram depicting operations of a touch detecting apparatus for comparison.
Figure 13:
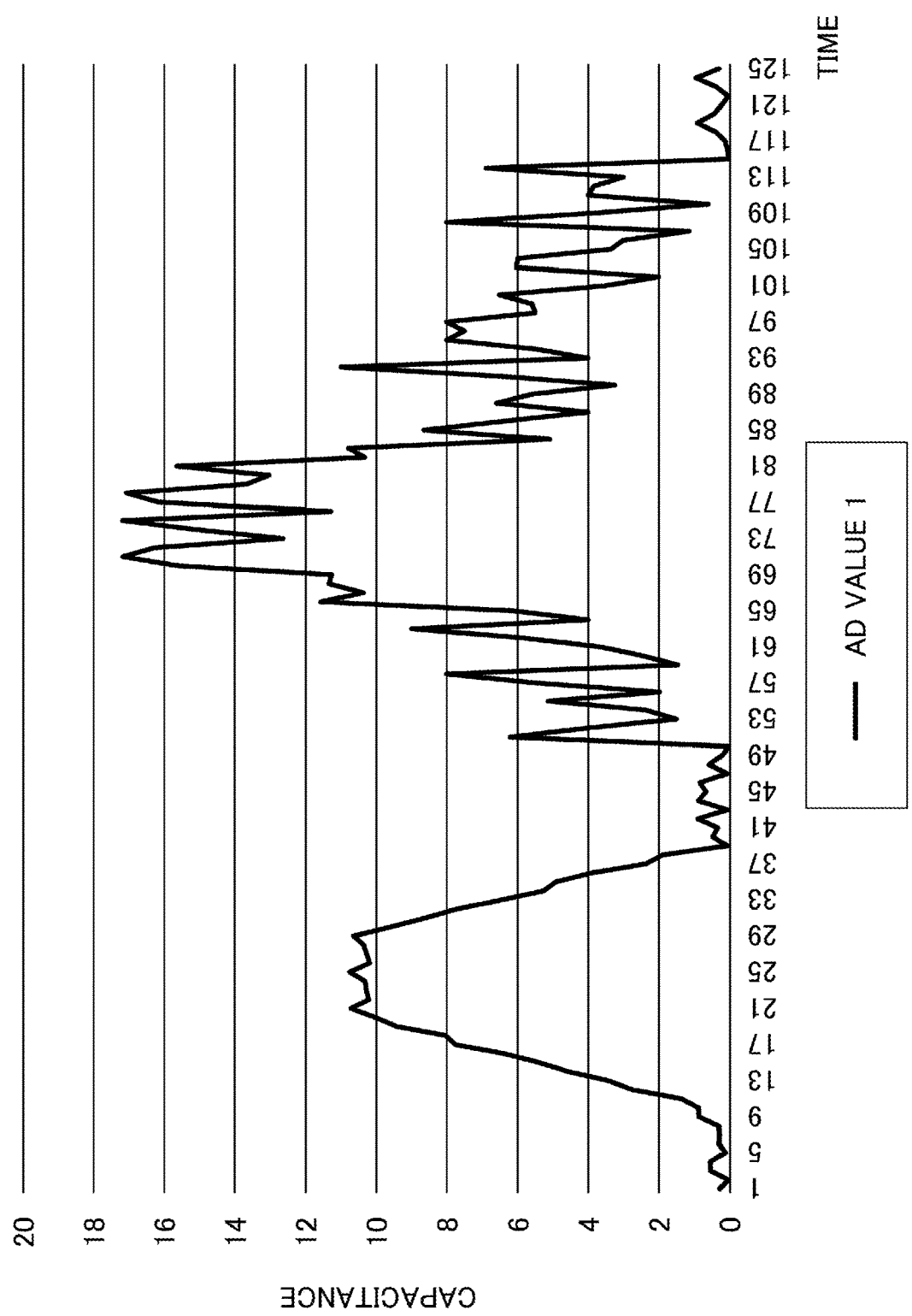
FIG. 13 is a diagram depicting operations of a touch detecting apparatus for comparison.
Figure 14:
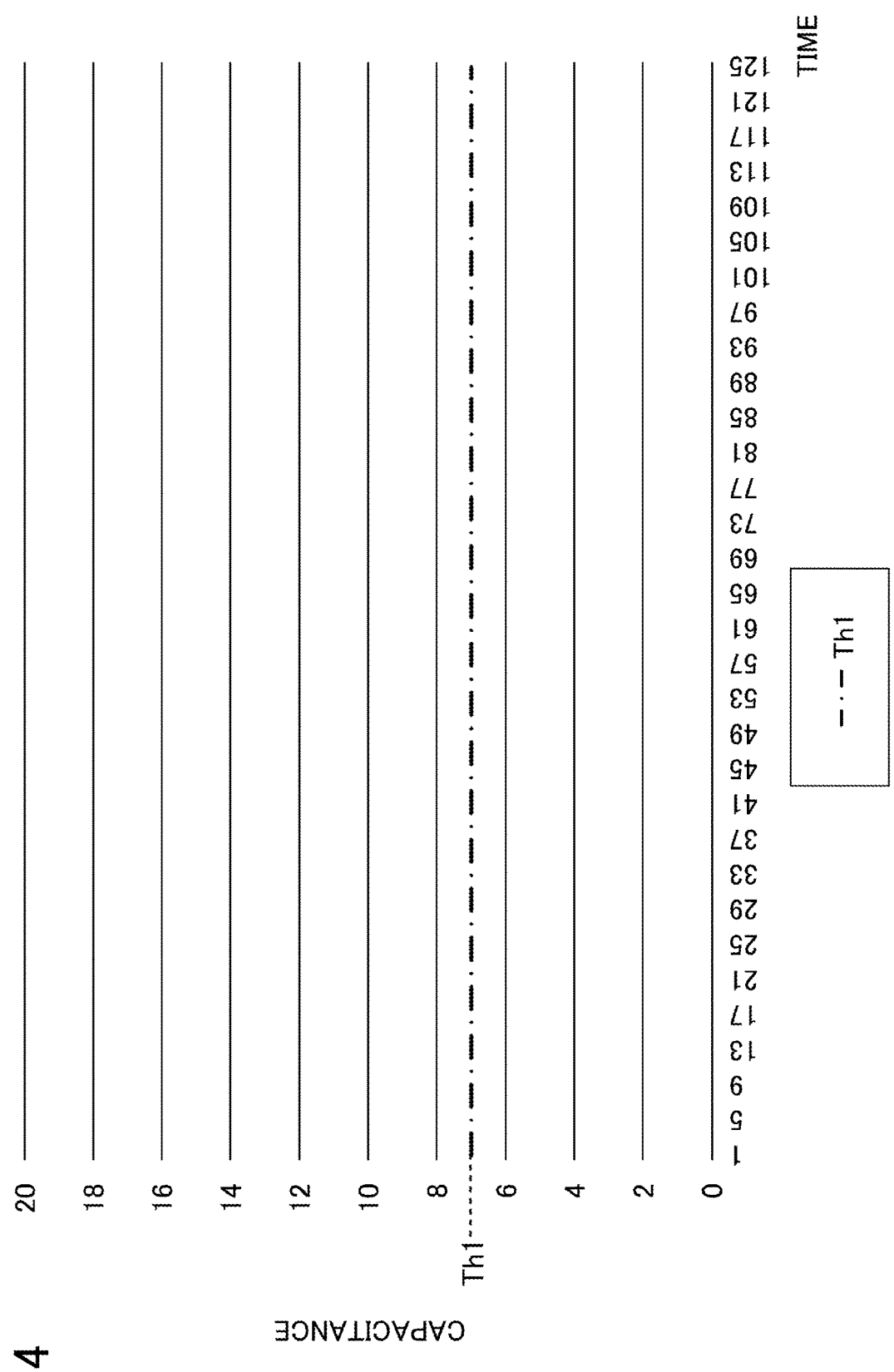
FIG. 14 is a diagram depicting operations of a touch detecting apparatus for comparison.
Figure 15:
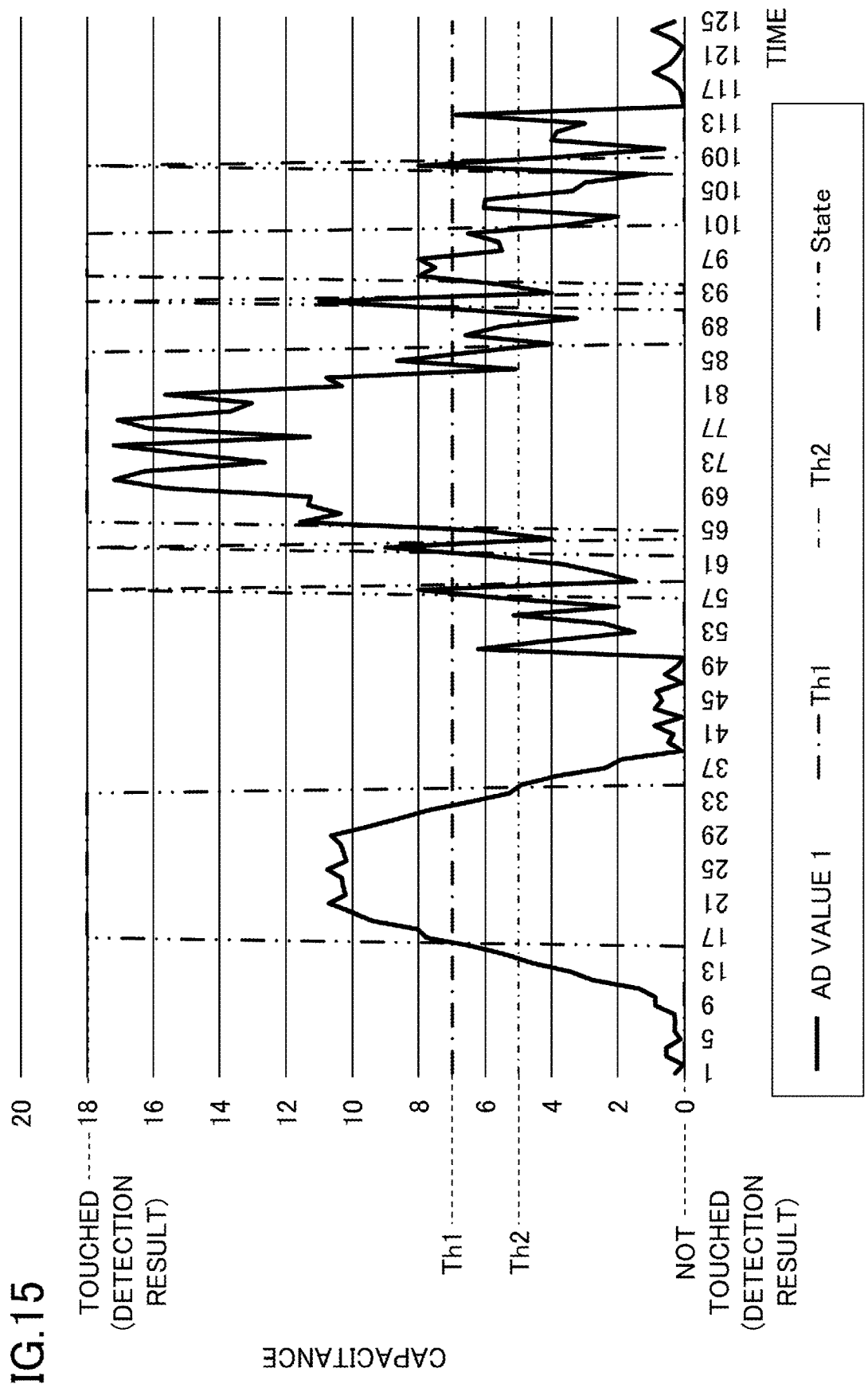
FIG. 15 is a diagram depicting operations of a touch detecting apparatus for comparison.

FIG. 12 depicts an AD value 1, the turn-on threshold Th1, the turn-off threshold Th2, and a touch state "State". FIG. 13 depicts an AD value 1. FIG. 14 depicts the turn-on threshold Th1. FIG. 15 depicts an AD value 1, the turn-on threshold Th1, the turn-off threshold Th2, and a touch state "State".

From time 11, a hand H begins to hold the grip 11. Accordingly, an amplitude AD value 1 increases. At time 17, the amplitude AD value 1 becomes greater than or equal to the turn-on threshold Th1. At this point in time, a touch state "State" immediately switches to a being-touched state.

The hand H begins to remove from the grip 11 at time 30. Accordingly, the amplitude AD value 1 decreases. At time 35, the AD value 1 becomes smaller than or equal to the turn-off threshold Th2. At this point in time, the touch state "State" immediately switches to a not-being-touched state.

From time 51 to time 114, a noise amount is large. During the interval, the moment at which a large amount of a noise component is added to the amplitude AD value 1 occurs frequently. Because the AD value 1 exceeds the turn-on threshold Th1 at times 58 and 63, the touch state "State" switches to a being-touched state. At this moment, a hand H does not actually hold the grip 11 and the erroneous detection occurs.

At time 61, a hand H begins to hold the grip 11. At time 66, the amplitude AD value 1 exceeds the turn-on threshold Th1. At this moment, the touch state "State" switches to a being-touched state.

The hand H begins to remove from the grip 11 at time 80. As a result, the AD value of 1 begins to fall. At time 87, the AD value 1 becomes smaller than or equal to the turn-off threshold Th2. At this moment, the touch state "State" immediately switches to a not-being-touched state.

Because the AD value 1 exceeds the turn-on threshold Th1 at time 92, times 95 to 100, and time 108, the touch state "State" switches to a being-touched state. At this moment, a hand H does not actually hold the grip 11 and the erroneous detection occurs.

As described above, according to the touch detecting apparatus for comparison, when noise is generated, an erroneous detection occurs and it is not possible to detect an actual movement of a hand H. On the other hand, according to the touch detecting apparatus 100 of the embodiment, as depicted in FIGS. 8 to 11, when noise is generated, the correction value CorrectionTh1 is added to the turn-on threshold Th1 so that an erroneous detection can be avoided and it is possible to accurately detect an actual movement of a hand H.

<Variant>

The touch detecting apparatus 100 according to a variant uses a plurality of noise thresholds and a plurality of correction values for the turn-on threshold Th1. A variant of the subroutine "sub initial setting" and a variant of the subroutine "sub turn-on threshold Th1 correction" will be described with reference to FIGS. 16 and 17.

<Variant of Subroutine "Sub Initial Setting">

Figure 16:
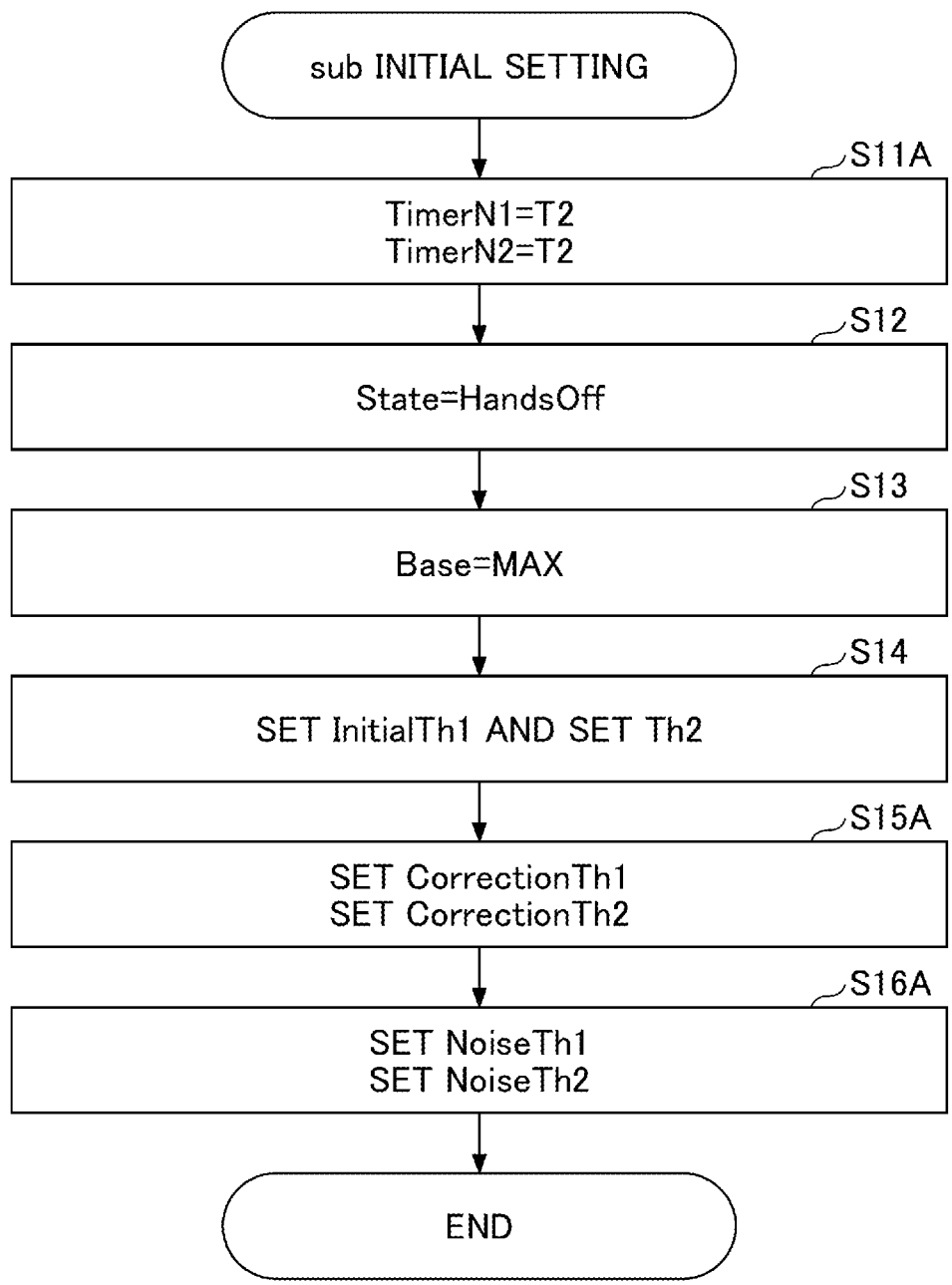
FIG. 16 is a flowchart depicting processing with respect to a subroutine "sub initial setting" according to a variant.

FIG. 16 is a diagram depicting a flowchart depicting a processing of a subroutine "sub initial setting" according to the variant. The process depicted in FIG. 16 can be executed as the process of step S1 in the main flow depicted in FIG. 4 instead of the process of the subroutine "sub initial setting" of FIG. 5.

In step S11A, the touch detecting unit 122 sets time count values TimerN1 and TimerN2 of the first timer 122A to T2. That is, TimerN1=T2 and TimerN2=T2 are set. The time T2 is an example of a second predetermined time and is stored in the memory 123. In the variant, the first timer 122A counts two time count values TimerN1 and TimerN2.

Because steps S12 to S14 are identical to steps S12 to S14 of FIG. 5, the description is omitted.

In step S15A, the touch detecting unit 122 sets CorrectionTh1 and CorrectionTh2 as correction values for the turn-on threshold Th1. The correction value CorrectionTh1 is greater than the correction value CorrectionTh2, and the correction value CorrectionTh2 is a correction value used when middle noise occurs. The correction value CorrectionTh1 is an example of a first correction value and the correction value CorrectionTh2 is an example of a second correction value. CorrectionTh1 and CorrectionTh2 are stored in memory 123. The correction values CorrectionTh1 and CorrectionTh2 are determined in advance by, for example, simulations or experiments so that the effects of large noise and middle noise can be reduced.

In step S16A, the touch detecting unit 122 sets noise thresholds NoiseTh1 and NoiseTh2. The noise threshold NoiseTh1 is greater than the noise threshold NoiseTh2. The noise threshold NoiseTh1 is an example of a first noise threshold, and the noise threshold NoiseTh2 is an example of a second noise threshold. The noise threshold NoiseTh1 is used to detect generation of large noise, and the noise threshold NoiseTh2 is used to detect generation of middle noise. The noise thresholds NoiseTh1 and NoiseTh2 are stored in the memory 123. The values of the noise thresholds NoiseTh1 and NoiseTh2 may be determined in advance by, for example, simulations or experiments in order to identify large noise and middle noise. The processing of the subroutine "sub initial setting" ends when the above-described steps S11A to S16A have been executed.

<Variant of Subroutine "Sub Turn-on Threshold Th1 Correction">

FIG. 17 is a diagram depicting a flowchart depicting processing of the subroutine "sub turn-on threshold Th1 correction" according to the variant. The process depicted in FIG. 17 can be executed as the process of step S5 in the main flow depicted in FIG. 4 instead of the process of the subroutine "sub turn-on threshold Th1 correction" of FIG. 6.

In step S51A, the touch detecting unit 122 determines whether a noise amount Noise is greater than the noise threshold NoiseTh1. This process is to determine whether there is large noise.

In step S52A, when determining that the noise amount Noise is greater than the noise threshold NoiseTh1 (S51A: Yes), the touch detecting unit 122 resets the time count values TimerN1 and TimerN2 of the first timer 122A. That is, the time count values TimerN1 and TimerN2 of the first timer 122A are set to 0. Accordingly, TimerN1=0 and TimerN2=0 are set, and counting operations of the two time count values TimerN1 and TimerN2 of the first timer 122A restart.

In step S53A, the touch detecting unit 122 corrects the turn-on threshold Th1. Specifically, the touch detecting unit 122 adds the correction value CorrectionTh1 to the initial value InitialTh1 of the turn-on threshold Th1. That is, Th1=InitialTh1+CorrectionTh1 is calculated. CorrectionTh1 is added for the purpose of processing large noise.

In step S54B, when determining in step S51A that the noise amount Noise is not greater than the noise threshold NoiseTh1 (S51A: No), the touch detecting unit 122 increments the time count value TimerN1 of the first timer 122A by 1. That is, TimerN1=TimerN1+1 is calculated.

In step S51B, the touch detecting unit 122 determines whether the noise amount Noise is greater than the noise threshold NoiseTh2. This is to determine whether there is middle noise because there is no large noise.

In step S52B, when determining that the noise amount Noise is greater than the noise threshold NoiseTh2 (S51B: Yes), the touch detecting unit 122 resets the time count value TimerN2 of the first timer 122A. That is, the time count value TimerN2 of the first timer 122A is set to 0. Accordingly, TimerN2=0 is set, and counting of the time count value TimerN2 of the first timer 122A restarts.

In step S55B, the touch detecting unit 122 determines whether the time count value TimerN1 of the first timer 122A exceeds T2. The time count value TimerN1 indicates a time period having elapsed from the last occurrence of noise exceeding the NoiseTh1 to the present time. When determining that the time count value TimerN1 of the first timer 122A does not exceed T2 (S55B: No), the touch detecting unit 122 proceeds to step S53A. Until the time count value TimerN1 of the first timer 122A exceeds T2 as a result of (i) large noise being generated so that a determination Yes is made in step S51A and thereafter (ii) no large noise being generated so that a determination "No" is made in step S51A being repeated, a state where the correction value CorrectionTh1 has been added to the turn-on threshold Th1 in step S53A continues.

When determining in step S55B that the time count value Timer N1 exceeds T2 (S55B: Yes), the touch detecting unit 122 proceeds to the next step (step S56B).

In step S56B, the touch detecting unit 122 returns the time count value TimerN1 of the first timer 122A to T2 in order to avoid digit overflow of the time count value TimerN1.

In step S53B, the touch detecting unit 122 corrects the turn-on threshold Th1. Specifically, the touch detecting unit 122 adds the correction value CorrectionTh2 to the initial value InitialTh1 of the turn-on threshold Th1. That is, Th1=InitialTh1+CorrectionTh2 is calculated. CorrectionTh2, which is smaller than CorrectionTh1, is thus added to deal with the condition of middle noise.

In step S54C, when determining in step S51B that the noise amount Noise is not greater than the noise threshold NoiseTh2 (S51B: No), the touch detecting unit 122 increments the time count value TimerN2 of the first timer 122A by one. That is, TimerN2=TimerN2+1 is calculated. This process is to count the time having elapsed after there comes to be no middle noise.

In step S55C, the touch detecting unit 122 determines whether the time count value TimerN2 of the first timer 122A exceeds T2. The time count value TimerN2 indicates the time having elapsed from the last occurrence of noise exceeding NoiseTh2 to the present time. When determining that the time count value Timer N2 does not exceed T2 (S55C: No), the touch detecting unit 122 proceeds to step S56B. Thus, after middle noise is last detected, a state where the correction value CorrectionTh2 for dealing with middle noise has been added to the turn-on threshold Th1 in step S53B continues for a certain period of time.

When it is determined in step S55C that the time count value Timer N2 exceeds T2 (S55C: Yes), the touch detecting unit 122 proceeds to the next step (step S56C).

The touch detecting unit 122 returns the time count value TimerN2 of the first timer 122A to T2 in order to avoid digit overflow of the time count value TimerN2. In the same manner, in order to avoid digit overflow of the time count value TimerN1, the time count value TimerN1 of the first timer 122A is returned to T2 (step S56C).

In step S57, the touch detecting unit 122 sets the turn-on threshold Th1 to the initial value InitialTh1. Thus, the turn-on threshold Th1 is set to the initial value InitialTh1 in response to a continuation of a state where the noise level is lower than middle level. When steps S51A to S57 have been thus performed, the process of the "sub turn-on threshold Th1 correction" of the variant ends.

<Operations of Touch Detecting Apparatus of Variant of Embodiment>

FIGS. 18 to 21 are diagrams depicting operations of the touch detecting apparatus according to the variant of the embodiment. In FIGS. 18 to 21, the horizontal axis corresponds to time (no units).

Figure 18:
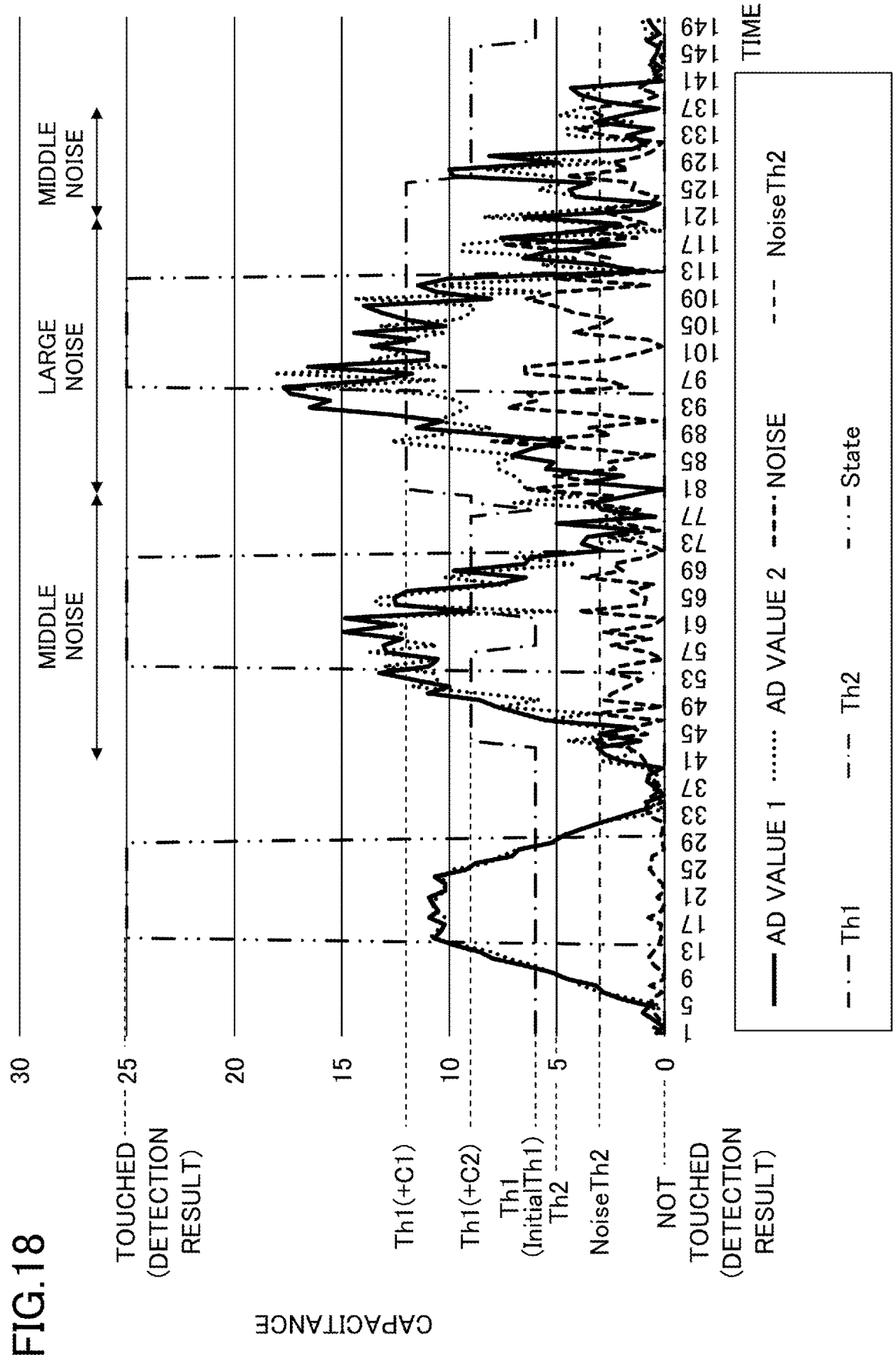
FIG. 18 is a diagram depicting operations of the touch detecting apparatus according to the variant.
Figure 19:
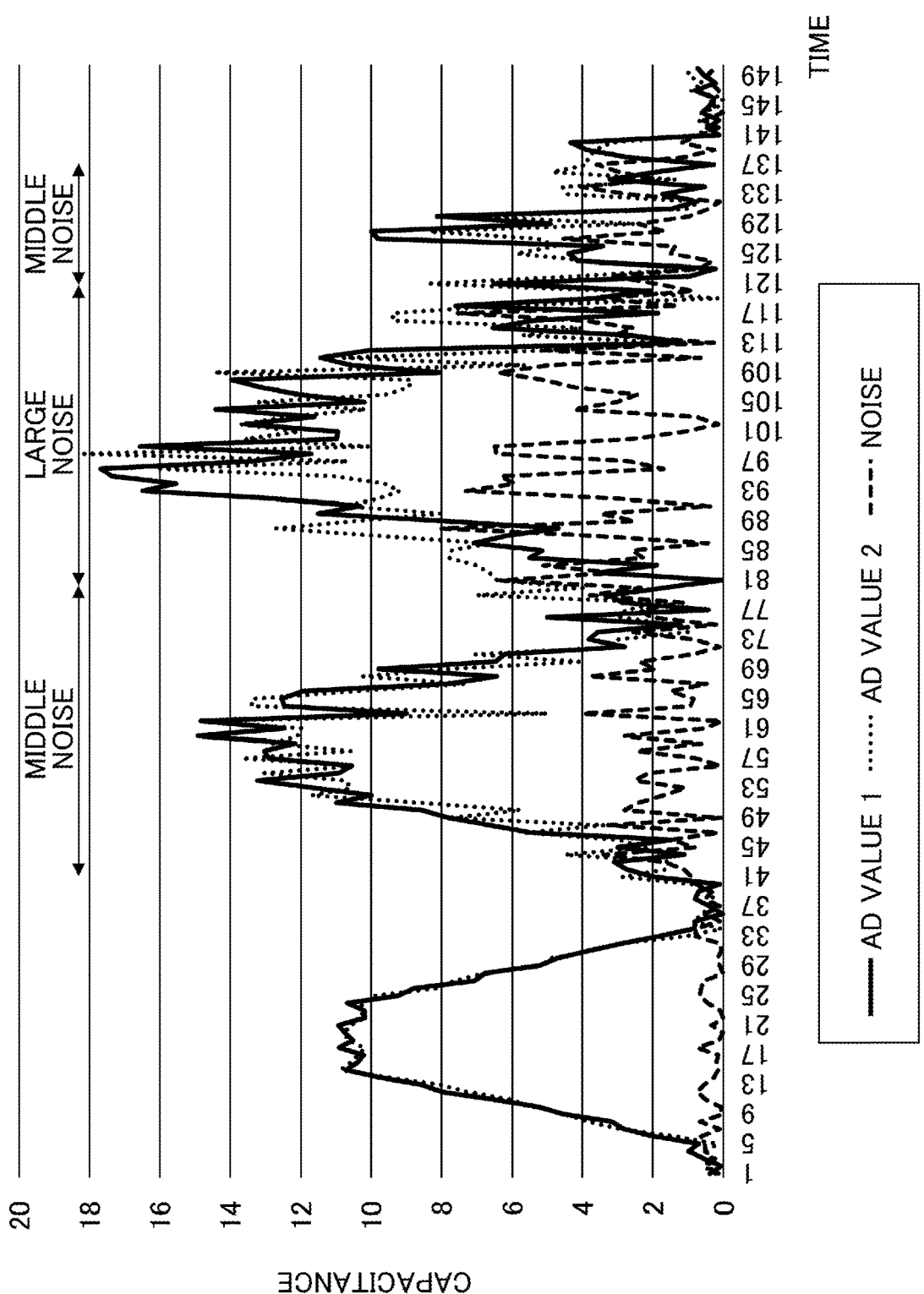
FIG. 19 is a diagram depicting operations of the touch detecting apparatus according to the variant.
Figure 20:
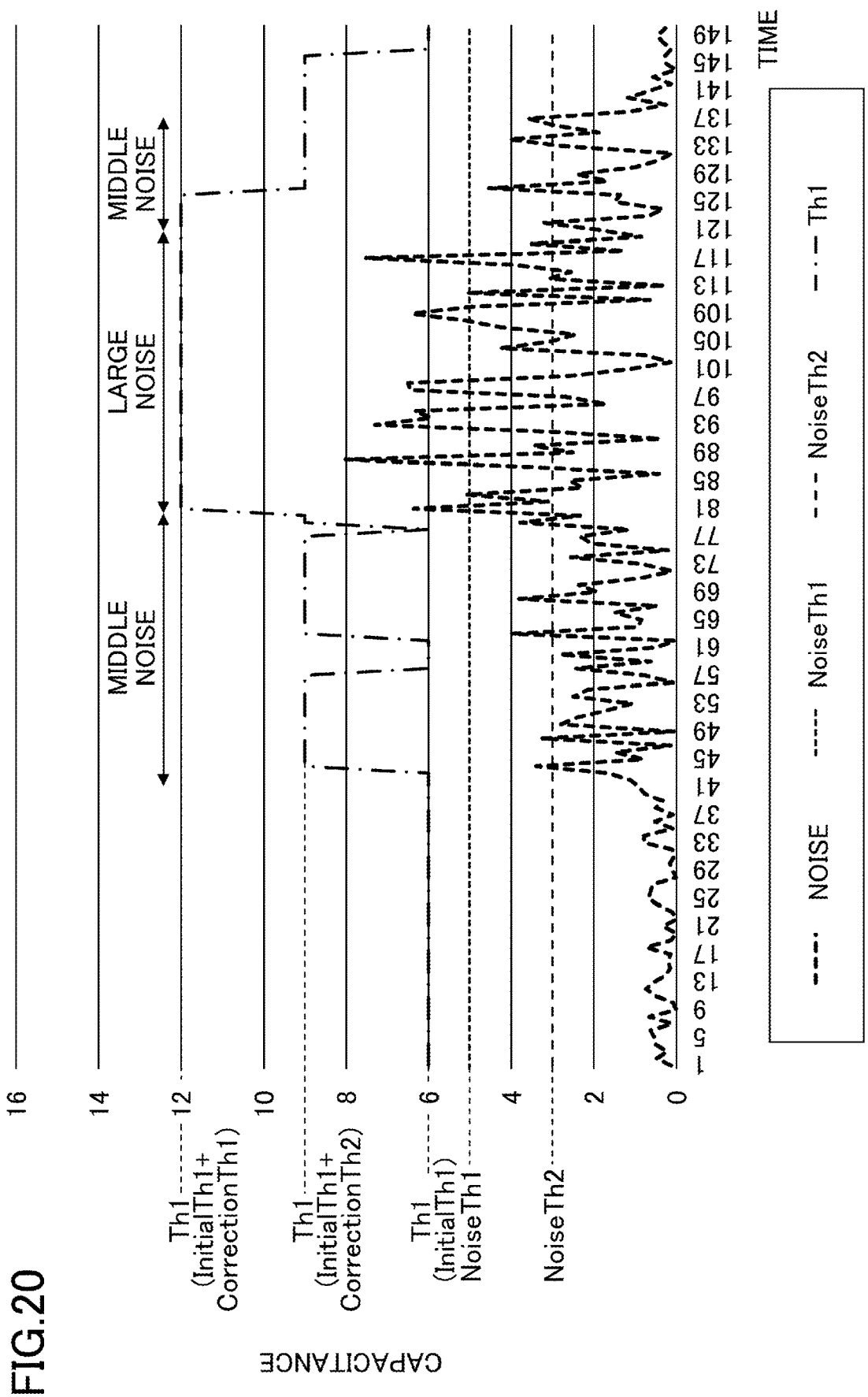
FIG. 20 is a diagram depicting operations of the touch detecting apparatus according to the variant.
Figure 21:
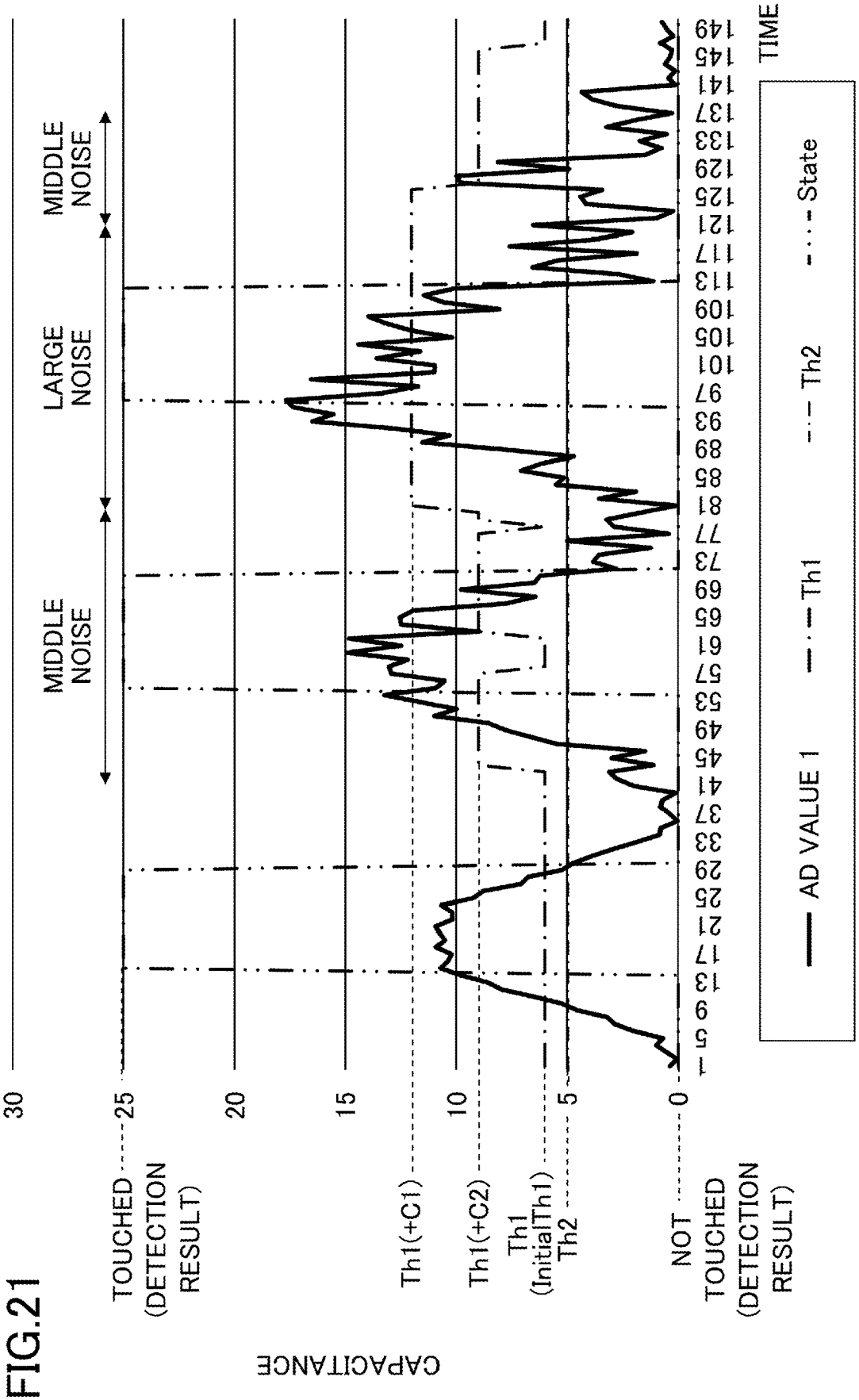
FIG. 21 is a diagram depicting operations of the touch detecting apparatus according to the variant.

FIG. 18 depicts an AD value 1, an AD value 2, noise, a noise threshold NoiseTh2, a turn-on threshold Th1, a turn-off threshold Th2, and a touch state "State". FIG. 19 depicts an AD value 1, an AD value 2, and noise. FIG. 20 depicts noise, a noise thresholds NoiseTh1 and NoiseTh2, and a turn-on threshold Th1. FIG. 21 depicts an AD value 1, a turn-on threshold Th1, a turn-off threshold Th2, and a touch state "State".

In FIG. 18, "Th1(+C1)" represents a turn-on threshold Th1 obtained by adding the correction value CorrectionTh1 for dealing with large noise to the initial value InitialTh1. "Th1(+C2)" represents the turn-on threshold Th1 obtained by adding the correction value CorrectionTh2 for dealing with medium noise to the initial value InitialTh1. "Th1 (InitialTh1)" represents the initial value InitialTh1.

The upper parts of FIGS. 18 to 21 depict time periods during which middle noise and large noise are generated by double-ended arrows. Middle noise is, for example, noise generated at the steering wheel 10 as a result of telephone conversation being performed using a smartphone in the rear seat of a vehicle. Large noise is, for example, noise generated at the steering wheel 10 as a result of telephone conversation being performed using a smartphone in the front passenger seat of the vehicle.

First, a hand H is not in touch with the grip 11 (a not-being-touched state), then a hand H is in touch with the grip 11, and again, a hand H is not in touch with the grip 11 (a not-being-touched state). Then, after noise is generated, the hand H touches the grip 11, and again, the hand H is removed from the grip 11 (a not-being-touched state). In the presence of noise, the hand H is then removed from the grip 11 (a not-being-touched state), and the hand H comes to be in touch with the grip 11 again. Then, the hand H is removed from the grip 11 (a not-being-touched state). Thus, after the hand H is not touch with the grip 11, the grip 11 is held three times by the hand H, and finally the hand H is removed from the grip 11. Whether touch state "State" detection results provided by the touch detecting apparatus according to the variant agree to these movements of the hand H will now be described with reference to FIGS. 18 to 21.

As depicted in FIGS. 18 to 21, at time 6, the hand H begins to hold the grip 11. Accordingly, the AD value 1 rises. Because noise |AD value 1–AD value 2| is sufficiently small, the turn-on threshold Th1 is set to the minimum value InitialTh1. At time 11, the AD value 1 becomes greater than or equal to the turn-on threshold Th1. Then, the touch state "State" switches to a being-touched state at time 15. The time period (5) from time 11 when the AD value 1 reaches or exceeds the turn-on threshold Th1 to time 15 when the touch state "State" switches to the being-touched state corresponds to a time T3.

At time 25, the hand H begins to remove from the grip 11. As a result, the AD value 1 begins to fall. At time 30, the AD value 1 becomes smaller than or equal to the turn-off threshold Th2. At this moment, the touch state "State" immediately switches to a not-being-touched state.

Telephone conversation is occurring in the rear seat from time 41 to time 140, and thus, noise increases. When the noise threshold NoiseTh2 is exceeded at time 44, the turn-on threshold Th1 is corrected and thus, the correction value CorrectionTh2 is added to the turn-on threshold Th1. The turn-on threshold Th1 thus increases to InitialTh1+CorrectionTh2.

At time 46, the hand H begins to hold the grip 11. As a result, the AD value 1 begins to increase again. At time 48, the AD value 1 exceeds InitialTh1, but the turn-on threshold Th1 has been increased by the correction, and thus, the touch state "State" does not switch to a being-touched state at this moment. In other words, there is no erroneous detection.

The turn-on threshold Th1 is set to the initial value InitialTh1 during time 58 through time 62 as a result of the measured noise becoming smaller than the noise threshold NoiseTh2 at time 49 and a time T2 being exceeded. In this interval, the noise has actually a middle level, but, by accident, a state where the same levels of noise are added to the AD values 1 and 2 continues. As a result, although the noise having the middle level is added, the turn-on threshold Th1 is set to the initial value InitialTh1 for a certain time period. However, as can be seen, the time period is limited to be short.

At time 51, the AD value 1 becomes greater than or equal to the turn-on threshold Th1. Then, at time 55, the touch state "State" switches to a being-touched state. A time period (5) from time 51 when the AD value 1 becomes greater than or equal to the turn-on threshold Th1 to time 55 when the touch state "State" switches to the being-touched state corresponds to a time T3.

When middle noise is again detected at time 63 and the measured noise exceeds the noise threshold NoiseTh2, the turn-on threshold Th1 is corrected, and thus, the correction value CorrectionTh2 is added. Thus, the turn-on threshold Th1 increases to InitialTh1+CorrectionTh2.

At time 65, the hand H begins to remove from the grip 11. As a result, the AD value 1 begins to fall. At time 72, the AD value 1 becomes smaller than or equal to the turn-off threshold Th2. At this moment, the touch state "State" immediately switches to a not-being-touched state.

At time 78, the turn-on threshold Th1 is returned the initial value InitialTh1 because, at time 69, noise becomes smaller than the noise threshold NoiseTh and a time T2 is exceeded. In this interval, a state where noises of approximately the same levels are added to the AD value 1 and the AD value 2 continues by accident while the actual noise level is a middle level. As a result, although the noises of the middle levels are added, the turn-on threshold Th1 is set to the initial value InitialTh1 for a certain time period. However, as can be seen, the time period is limited to be short.

Telephone conversation using the smartphone is made in the front passenger seat from time 81 to time 130. In response to the noise thus increasing and exceeding the noise threshold NoiseTh1 as depicted in FIG. 20, the turn-on threshold Th1 is corrected, and thus, the correction value CorrectionTh1 is added. The turn-on threshold Th1 thus increases to InitialTh1+CorrectionTh1.

At time 92, the AD value 1 becomes greater than or equal to the turn-on threshold Th1. Then, at time 96, the touch state "State" switches to a being-touched state. A time period (5) from time 92 when the AD value 1 becomes greater than or equal to the turn-on threshold Th1 to time 96 when the touch state "State" switches to the being-touched state corresponds to a time T3.

At time 105, the hand H begins to remove from the grip 11. As a result, the AD value 1 begins to fall. At time 113, the AD value 1 becomes smaller than or equal to turn-off threshold Th2. At this moment, the touch state "State" immediately switches to a not-being-touched state.

At time 131, the telephone conversation using the smartphone in the front passenger seat ends and only the telephone conversation in the rear seat continues. In this example, the noise measured when the telephone conversation using the smartphone in the front passenger seat occurs is reduced. Thus, at time 118, the noise is smaller than the noise threshold NoiseTh1 and greater than or equal to the noise threshold NoiseTh2, and a time T2 is exceeded. As a result, at time 127, the turn-on threshold Th1 switches from a state where the correction value CorrectionTh1 has been added thereto to a state where the correction value CorrectionTh2 has been added thereto instead. That is, the turn-on threshold Th1 decreases. From time 81 to time 130, actually, there is large noise detected by the electrostatic sensor 110. However, from time 118 to time 130, the difference between the noise component with respect to the AD value 1 and the noise component with respect to the AD value 2 is small. In other words, a state where the measured noise |AD value 1–AD value 2| is small with respect to the actual noise continues. Therefore, the turn-on threshold Th1 is switched to a state where the correction value CorrectionTh2 for a middle noise component has been added thereto at time 127 when noise is actually large. The time period using the correction value CorrectionTh2 for a middle noise component although the actual noise is large is from time 127 to time 130. It can be seen that, although there is the time period during which the correction value CorrectionTh2 for a middle noise is used despite the actual noise being large, the time period is limited to be short.

As described above, from time 127 to time 130, the turn-on threshold Th1 has a value for a noise component having a middle level, despite the actual noise being large. Therefore, due to the noise, the AD value 1 instantaneously has a value greater than or equal to the turn-on threshold Th1, from time 127 to time 128. However, because the state does not last for a time T3, the touch state "State" is kept as a not-being-touched state. According to the present disclosure, two techniques are used, i.e., (i) using a turn-on threshold appropriate for the magnitude of noise and (ii) detecting that a touch occurs in response to a capacitance value exceeding the turn-on threshold for a certain period of time. A combination of these two techniques enables accurate touch detection even in a noisy environment. Furthermore, According to the present disclosure, detection of a noise magnitude is performed after a state where noise is smaller than a noise threshold continues for a certain time, and therefore, a likelihood of underestimating noise can be reduced.

In the above-described example, the telephone conversation in the rear seat ends at time 141. In this example, noise becomes smaller than the noise threshold NoiseTh2 at time 138 before the end of the telephone conversation in the rear seat, and a time T2 is exceeded. Then, as a result, at time 147, the turn-on threshold Th1 is returned to the initial value InitialTh1.

Thus, the two correction values CorrectionTh1 and CorrectionTh2 corresponding to the two noise thresholds NoiseTh1 and NoiseTh2 are used to correct the turn-on threshold Th1 in two stages, thereby it being possible to deal with large noise and middle noise stepwise.

Although the touch detecting apparatuses have been described with reference to the embodiments, the present invention is not limited to these embodiments, and various modifications or variations can be made within the scope of the present invention.

What is claimed is:

1. A touch detecting apparatus, comprising:
an electrostatic sensor provided on an object; and
a processor configured to:
detect whether a hand touches the object based on a capacitance measured by the electrostatic sensor,
in response to the capacitance being greater than or equal to a first touch threshold, detect that a hand touches the object, and
when a change amount of the capacitance during a first predetermined time becomes greater than or equal to a noise threshold, continue, for a second predetermined time, a state where a correction value has been added to the first touch threshold,
wherein
the processor is further configured to
in response to the change amount of the capacitance during the first predetermined time becoming greater than or equal to the noise threshold, start counting time by a first timer, and
in response to the change amount of the capacitance during the first predetermined time becoming smaller than the noise threshold and the time counted by the first timer exceeding the second predetermined time, end continuing a state where the correction value has been added to the first touch threshold.

2. The touch detecting apparatus as claimed in claim 1, wherein
the processor is configured to, in response to the capacitance being greater than or equal to the first touch threshold for a period of time exceeding a third predetermined time, detect that a hand touches the object.

3. The touch detecting apparatus as claimed in claim 2, wherein
the object is a grip of a steering wheel of a vehicle, and
the processor is configured to, in response to the capacitance becoming smaller than or equal to a second touch threshold, immediately detect that a hand is not in touch with the grip.

4. The touch detecting apparatus as claimed in claim 3, wherein
the first touch threshold is greater than the second touch threshold.

5. The touch detecting apparatus as claimed in claim 1, wherein
the processor is configured to
in response to the change amount of the capacitance during the first predetermined
time becoming greater than or equal to the noise threshold before the time counted by the first timer exceeds the second predetermined time, reset the first timer and restart counting time by the first timer.

6. The touch detecting apparatus as claimed in claim 1, wherein
the noise threshold includes a first noise threshold and a second noise threshold smaller than the first noise threshold,
the correction value includes a first correction value and a second correction value smaller than the first correction value, and
the processor is configured to
in response to using the first noise threshold, use the first correction value.

7. The touch detecting as claimed in claim 6, wherein
the processor is configured to
in response to the change amount of the capacitance during the first predetermined
time becoming greater than or equal to the first noise threshold, start counting time by both a first timer and a second timer,
in response to the change amount of the capacitance during the first predetermined time exceeding the second noise threshold, start counting time by the second timer only,
before the time counted by the first timer exceeds the second predetermined time, add the first correction value to the first touch threshold, and
before the time counted by the second timer exceeds the second predetermined time after the time counted by the first timer exceeds the second predetermined time, continue a state where the second correction value has been added to the first touch threshold.

8. The touch detecting apparatus as claimed in claim 1, wherein the electrostatic sensor is inside a grip of a steering wheel of a vehicle.

* * * * *